(12) United States Patent
Kawashima et al.

(10) Patent No.: US 11,087,675 B2
(45) Date of Patent: Aug. 10, 2021

(54) DISPLAY DEVICE, OPERATION METHOD THEREOF, AND ELECTRONIC DEVICE

(71) Applicant: Semiconductor Energy Laboratory Co., Ltd., Atsugi (JP)

(72) Inventors: Susumu Kawashima, Atsugi (JP); Koji Kusunoki, Isehara (JP); Kazunori Watanabe, Machida (JP); Kouhei Toyotaka, Atsugi (JP); Kei Takahashi, Isehara (JP); Kentaro Hayashi, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/758,108

(22) PCT Filed: Nov. 1, 2018

(86) PCT No.: PCT/IB2018/058573
§ 371 (c)(1),
(2) Date: Apr. 22, 2020

(87) PCT Pub. No.: WO2019/092558
PCT Pub. Date: May 16, 2019

(65) Prior Publication Data
US 2020/0279525 A1    Sep. 3, 2020

(30) Foreign Application Priority Data

Nov. 9, 2017  (JP) .............................. JP2017-216389
Feb. 21, 2018 (JP) .............................. JP2018-028368

(51) Int. Cl.
*G09G 3/30* (2006.01)
*G09G 3/3225* (2016.01)
(Continued)

(52) U.S. Cl.
CPC ....... *G09G 3/3225* (2013.01); *H01L 27/3262* (2013.01); *H01L 27/3265* (2013.01);
(Continued)

(58) Field of Classification Search
CPC .. G09G 3/32; G09G 3/36; G09G 3/30; G09G 5/00; G06F 3/041; G06F 3/045; G06F 3/038
See application file for complete search history.

(56) References Cited

U.S. PATENT DOCUMENTS 6,563,480 B1 * 5/2003 Nakamura ............... G09G 3/32
                                                        315/169.1
7,674,650 B2    3/2010 Akimoto et al.
(Continued)

FOREIGN PATENT DOCUMENTS

CN   001421842 A   6/2003
JP   2001-228818 A  8/2001
(Continued)

OTHER PUBLICATIONS

Toyotaka.K et al., "OLED Display Device Mounted with a Novel External Compensating Circuit", SID Digest '18 : SID International Symposium Digest of Technical Papers, May 30, 2018, vol. 49, No. 1, pp. 44-47.
(Continued)

*Primary Examiner* — Pegeman Karimi
(74) *Attorney, Agent, or Firm* — Robinson Intellectual Property Law Office; Eric J. Robinson

(57) ABSTRACT

A display device that can display a high-luminance image is provided. The display device includes a display element and a memory circuit which is electrically connected to a first wiring and a second wiring. First, a reference potential is supplied to the first wiring. Next, a first image signal is supplied to the memory circuit through the second wiring.
(Continued)

Then, the second image signal is added to the first image signal by supplying the second image signal to the memory circuit through the first wiring. After that, an image obtained by superimposing an image corresponding to the first image signal and an image corresponding to the second image signal on each other is displayed with the display element.

12 Claims, 17 Drawing Sheets

(51) Int. Cl.
  *H01L 27/32* (2006.01)
  *H01L 29/786* (2006.01)
(52) U.S. Cl.
  CPC ...... *H01L 27/3276* (2013.01); *H01L 29/7869* (2013.01); *G09G 2300/0452* (2013.01); *G09G 2310/0297* (2013.01); *G09G 2320/0626* (2013.01); *G09G 2360/144* (2013.01)

(56) References Cited

U.S. PATENT DOCUMENTS

| | | | |
|---|---|---|---|
| 8,860,108 | B2 | 10/2014 | Yamazaki et al. |
| 2003/0098875 | A1 | 5/2003 | Kurokawa et al. |
| 2005/0231618 | A1* | 10/2005 | Sugiyama .............. H04N 5/335 348/273 |
| 2009/0286923 | A1* | 11/2009 | Kirino ..................... G02F 1/167 524/588 |
| 2013/0249883 | A1* | 9/2013 | Hwang ................ G09G 3/3275 345/212 |
| 2015/0138183 | A1* | 5/2015 | Kishi .................. H01L 27/1225 345/214 |
| 2017/0025080 | A1 | 1/2017 | Aoki |
| 2017/0345873 | A1* | 11/2017 | Li ........................ G09G 3/3208 |
| 2018/0182357 | A1* | 6/2018 | Yun .......................... G09G 5/10 |
| 2020/0194527 | A1 | 6/2020 | Kawashima et al. |

FOREIGN PATENT DOCUMENTS

| | | |
|---|---|---|
| JP | 2003-228350 A | 8/2003 |
| JP | 2003-248469 A | 9/2003 |
| JP | 2005-292584 A | 10/2005 |
| JP | 2007-096055 A | 4/2007 |
| JP | 2007-123861 A | 5/2007 |
| JP | 2011-119674 A | 6/2011 |
| JP | 2017-027012 A | 2/2017 |
| KR | 2003-0044858 A | 6/2003 |

OTHER PUBLICATIONS

International Search Report (Application No. PCT/IB2018/058573) dated Feb. 26, 2019.
Written Opinion (Application No. PCT/IB2018/058573) dated Feb. 26, 2019.

* cited by examiner

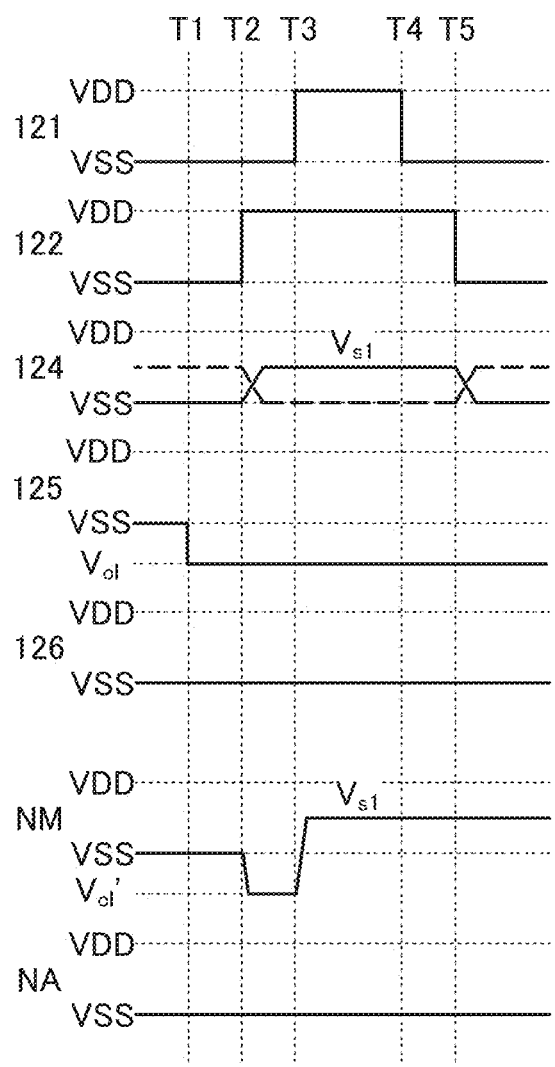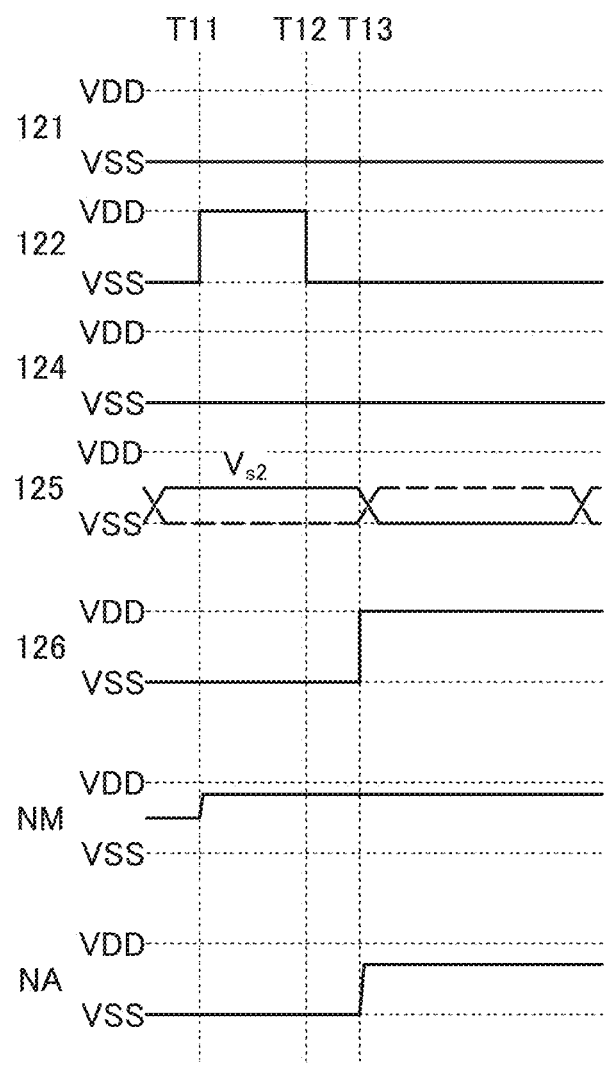

FIG. 3A1
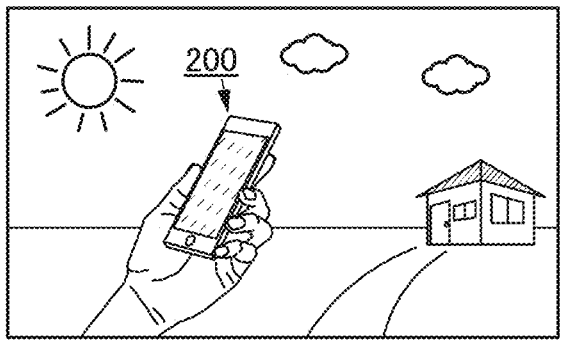
FIG. 3B1
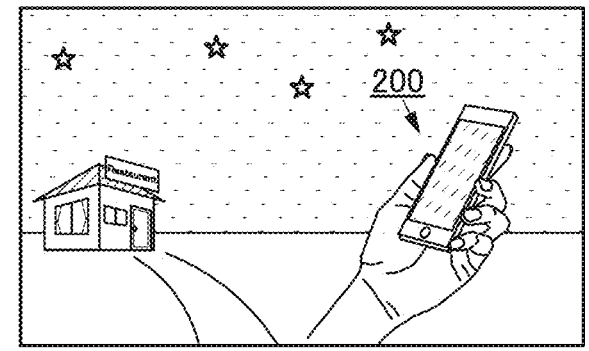
FIG. 3A2
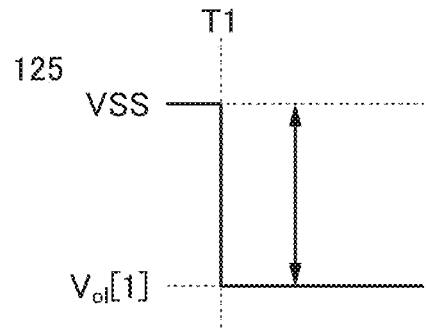
FIG. 3B2
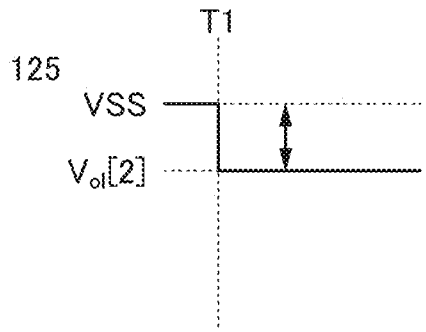

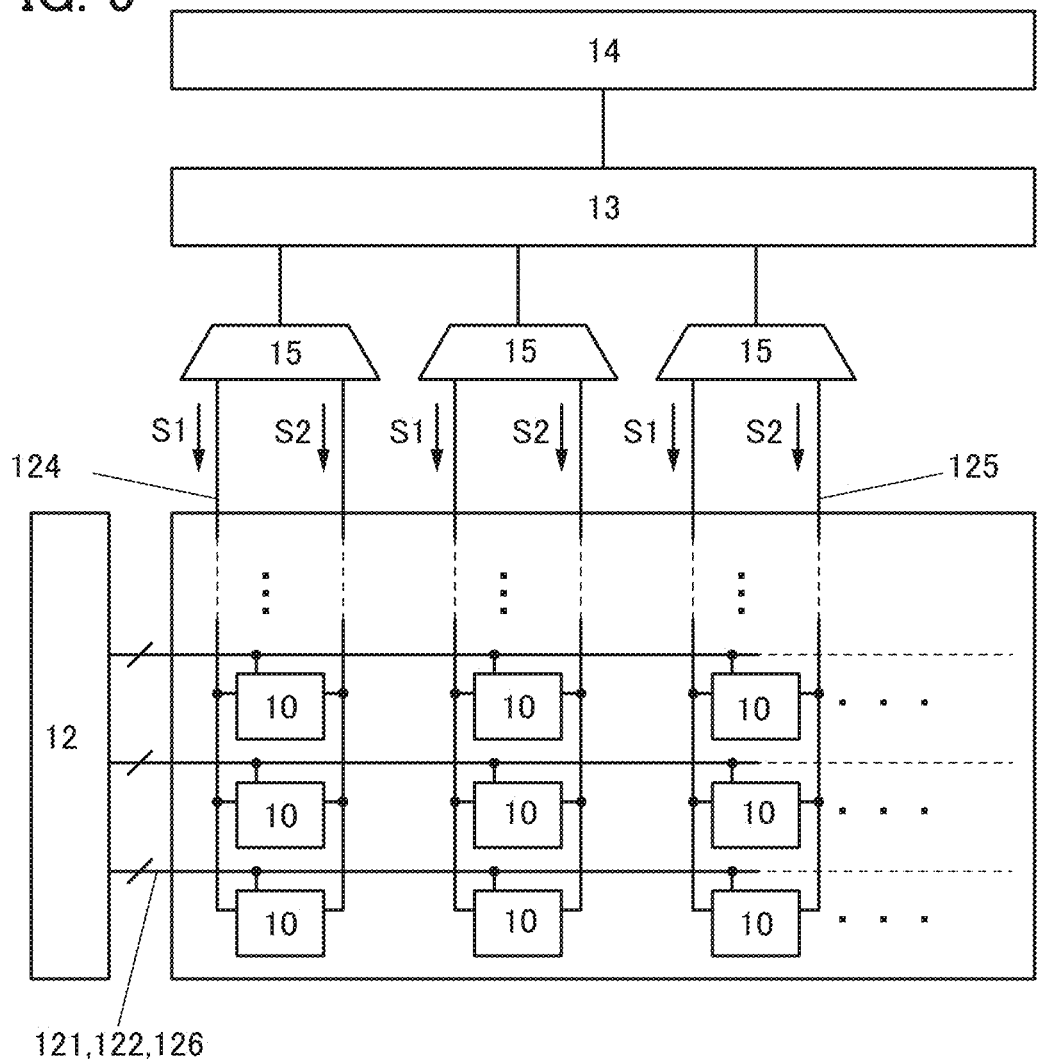

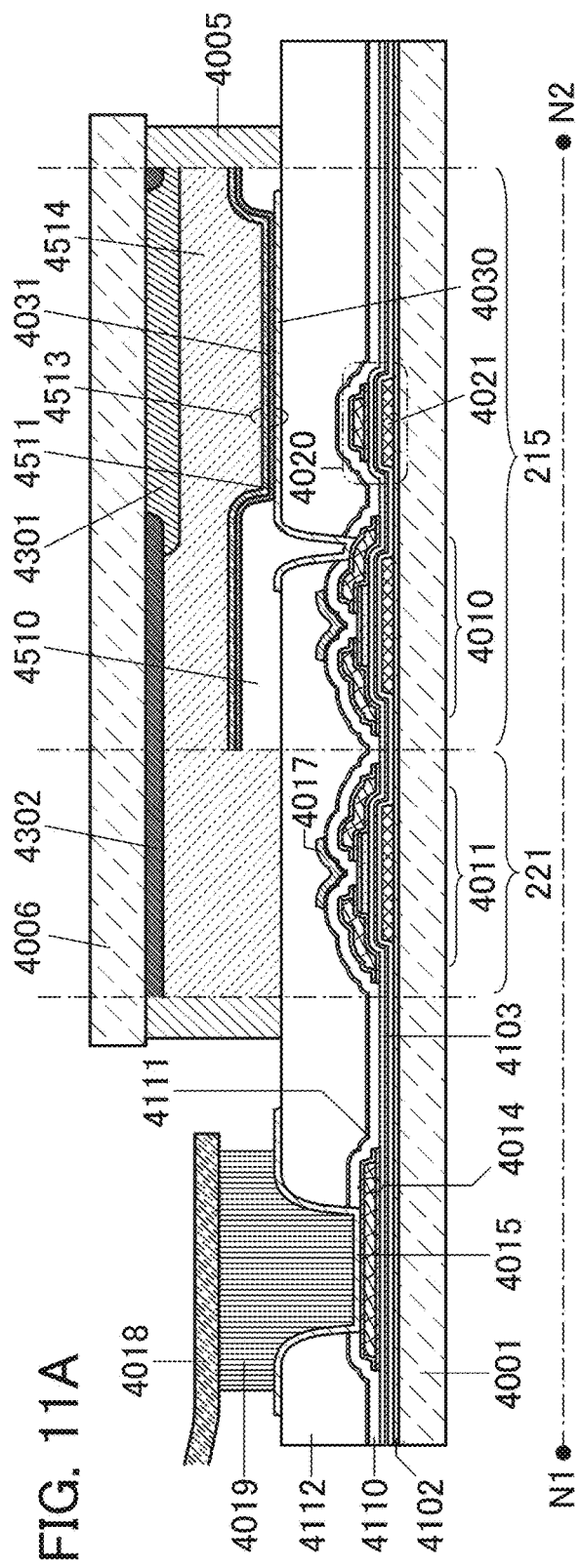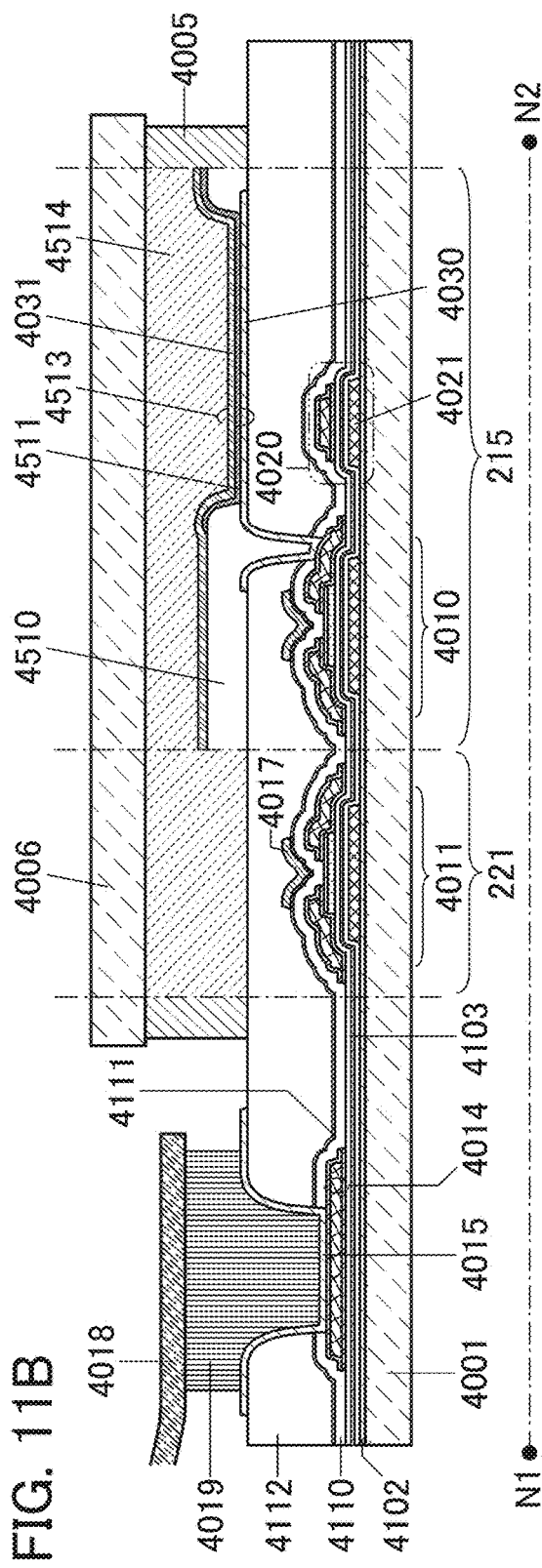

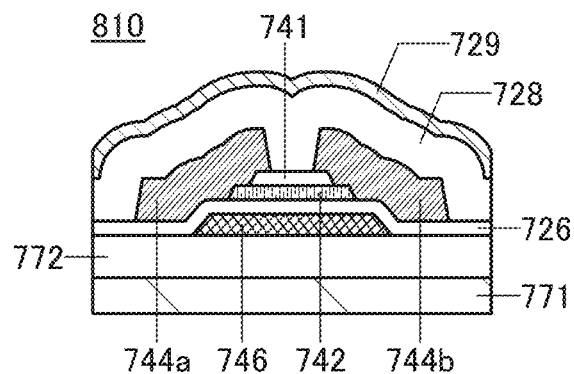
FIG. 12A1
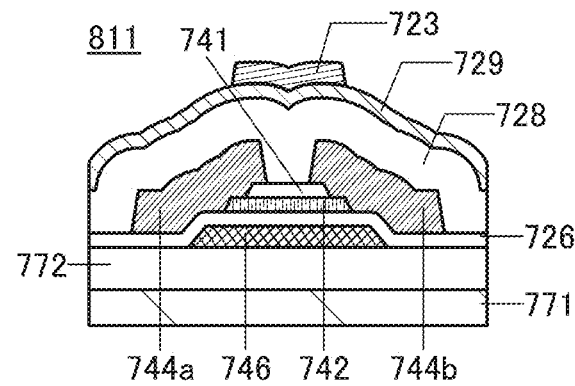
FIG. 12A2
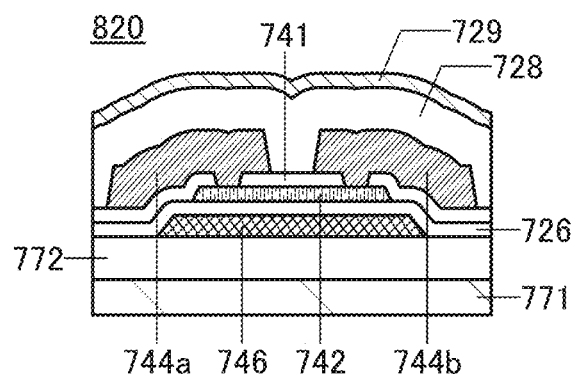
FIG. 12B1
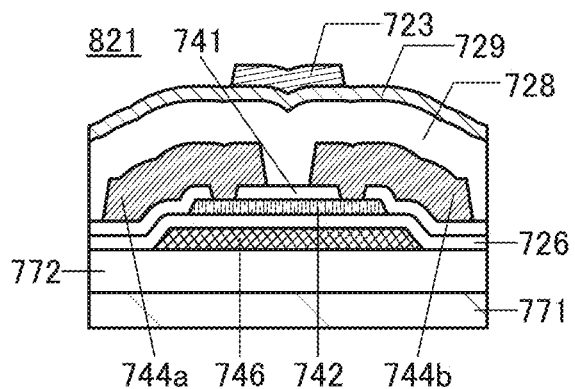
FIG. 12B2
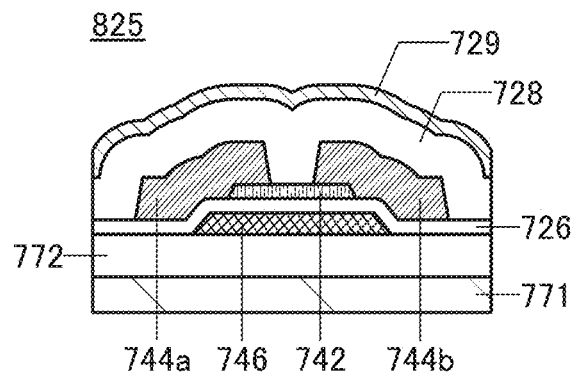
FIG. 12C1
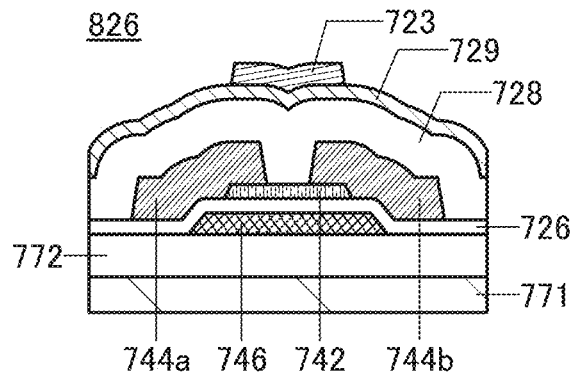
FIG. 12C2

FIG. 13A1
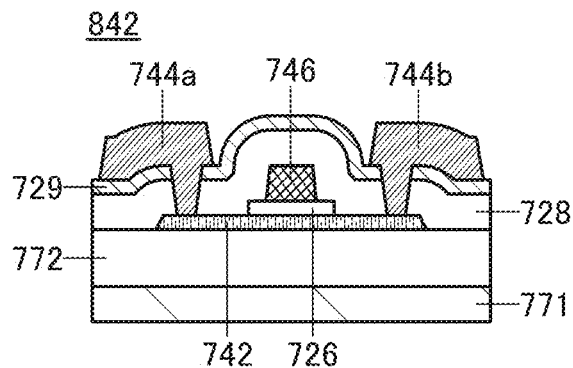
FIG. 13A2
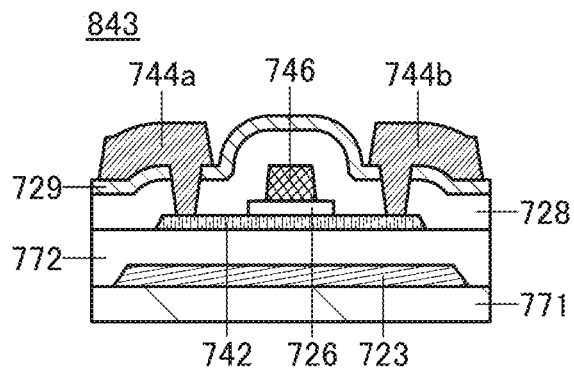
FIG. 13A3
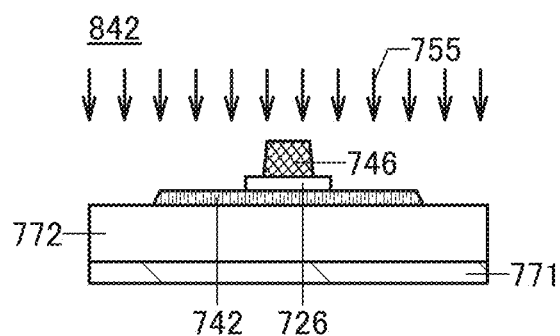
FIG. 13B1
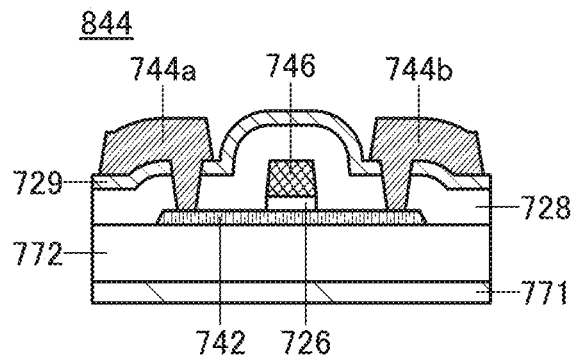
FIG. 13B2
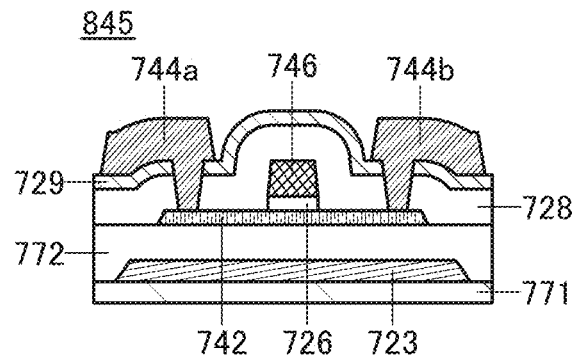
FIG. 13C1
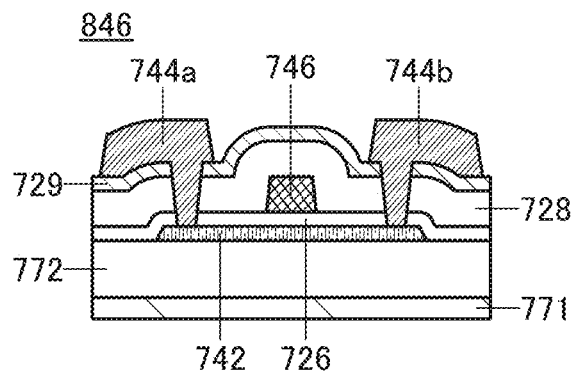
FIG. 13C2
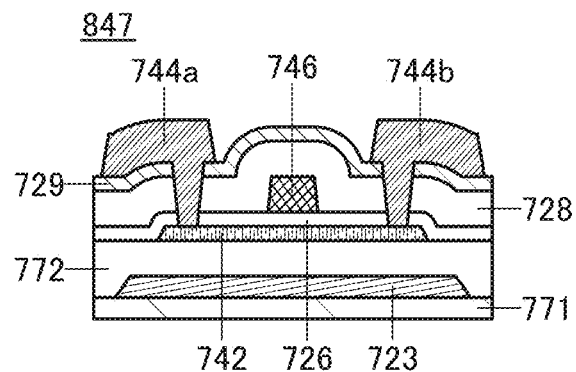

P1  P2

DISPLAY DEVICE, OPERATION METHOD THEREOF, AND ELECTRONIC DEVICE

TECHNICAL FIELD

One embodiment of the present invention relates to a display device and an operation method thereof, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor with the use of a metal oxide formed over a substrate has been attracting attention. For example, Patent Documents 1 and 2 each disclose techniques in which a transistor containing zinc oxide or an In—Ga—Zn-based oxide is used as a switching element or the like of a pixel in a display device.

Patent Document 3 discloses a memory device in which a transistor with an extremely low off-state current is used in a memory cell.

REFERENCES

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119674

DISCLOSURE OF INVENTION

In the case where a high-luminance image is displayed on a display device including an electroluminescent (EL) element and the like, a source driver needs to generate a high-potential image signal and supplies the high-potential image signal to a pixel including the EL element and the like. However, due to the withstand voltage and the like of the source driver, there is an upper limit on the level of the potential of the image signal that can be generated by the source driver. Furthermore, when the source driver generates a high-potential image signal, the power consumption of the display device increases.

An object of one embodiment of the present invention is to provide a display device that can display an image corresponding to an image signal having a potential higher than the potential that can be output from a source driver. Another object is to provide a display device that can display a high-luminance image. Another object is to provide a display device with a high dynamic range. Another object is to provide a display device with low power consumption. Another object is to provide a display device that can display an image whose luminance corresponds to the illuminance of external light. Another object is to provide a display device that can display an image with high visibility. Another object is to provide a highly reliable display device. Another object is to provide a novel display device and the like. Another object is to provide an operation method of the above display device. Another object is to provide a novel semiconductor device and the like.

Note that the descriptions of these objects do not disturb the existence of other objects. In one embodiment of the present invention, there is no need to achieve all these objects. Other objects will be apparent from and can be derived from the descriptions of the specification, the drawings, the claims, and the like.

One embodiment of the present invention is a display device including a pixel and a circuit. The pixel includes a first transistor, a second transistor, a third transistor, a fourth transistor, a first capacitor, a second capacitor, and a display element. One of a source and a drain of the first transistor is electrically connected to one electrode of the first capacitor. The other of the source and the drain of the first transistor is electrically connected to a first wiring. One of a source and a drain of the second transistor is electrically connected to the other electrode of the first capacitor. The other of the source and the drain of the second transistor is electrically connected to a second wiring. The one electrode of the first capacitor is electrically connected to a gate of the third transistor. The gate of the third transistor is electrically connected to one electrode of the second capacitor. One of a source and a drain of the third transistor is electrically connected to the other electrode of the second capacitor. The other electrode of the second capacitor is electrically connected to one of a source and a drain of the fourth transistor. The other of the source and the drain of the fourth transistor is electrically connected to one electrode of the display element. The circuit is electrically connected to the first wiring and the second wiring. The circuit has a function of supplying a first image signal to the first wiring. The circuit has a function of supplying a reference potential to the second wiring. The circuit has a function of supplying a second image signal to the second wiring.

In the above embodiment, the reference potential may be a potential having a value corresponding to the illuminance of external light.

In the above embodiment, the reference potential may be lower as the illuminance of external light is higher.

In the above embodiment, the reference potential may be a negative potential.

In the above embodiment, a capacitance value of the first capacitor may be higher than a capacitance value of the second capacitor.

In the above embodiment, the display element may be an organic EL element.

In the above embodiment, the first transistor may include a metal oxide in its channel formation region and the metal oxide may contain In, Zn, and M (M is Al, Ti, Ga, Sn, Y, Zr, La, Ce, Nd, or Hf).

Another embodiment of the present invention is an electronic device including the display device of one embodiment of the present invention and a camera.

Another embodiment of the present invention is an operation method of a display device including a pixel that includes a display element and a memory circuit which is electrically connected to a first wiring and a second wiring. A reference potential is supplied to the first wiring. A first image signal is stored in the memory circuit through the second wiring. A second image signal is added to the first image signal by supplying the second image signal to the memory circuit through the first wiring. An image obtained by superimposing an image corresponding to the first image signal and an image corresponding to the second image signal on each other is displayed by the display element.

In the above embodiment, the reference potential may be a potential having a value corresponding to the illuminance of external light.

In the above embodiment, the reference potential may be lower as the illuminance of external light is higher.

In the above embodiment, the reference potential may be a negative potential.

According to one embodiment of the present invention, a display device that can display an image corresponding to an image signal having a potential higher than the potential that can be output from a source driver can be provided. Alternatively, a display device that can display a high-luminance image can be provided. Alternatively, a display device with a high dynamic range can be provided. Alternatively, a display device with low power consumption can be provided. Alternatively, a display device that can display an image whose luminance corresponds to the illuminance of external light can be provided. Alternatively, a display device that can display an image with high visibility can be provided. Alternatively, a highly reliable display device can be provided. Alternatively, a novel display device and the like can be provided. Alternatively, an operation method of the above display device can be provided. Alternatively, a novel semiconductor device and the like can be provided.

BRIEF DESCRIPTION OF DRAWINGS

FIGS. 2A and 2B are each a timing chart showing an operation example of a pixel circuit;

FIGS. 3A1, 3A2, 3B1, and 3B2 illustrate an operation example of a pixel circuit;

FIG. 5 is a block diagram illustrating a structure example of a display device;

FIGS. 11A and 11B each illustrate a structure example of a display device;

FIGS. 12A1, 12A2, 12B1, 12B2, 12C1, and 12C2 each illustrate a structure example of a transistor;

FIGS. 13A1 to 13A3, 13B1, 13B2, 13C1, and 13C2 each illustrate a structure example of a transistor;

BEST MODE FOR CARRYING OUT THE INVENTION

Figure 1:
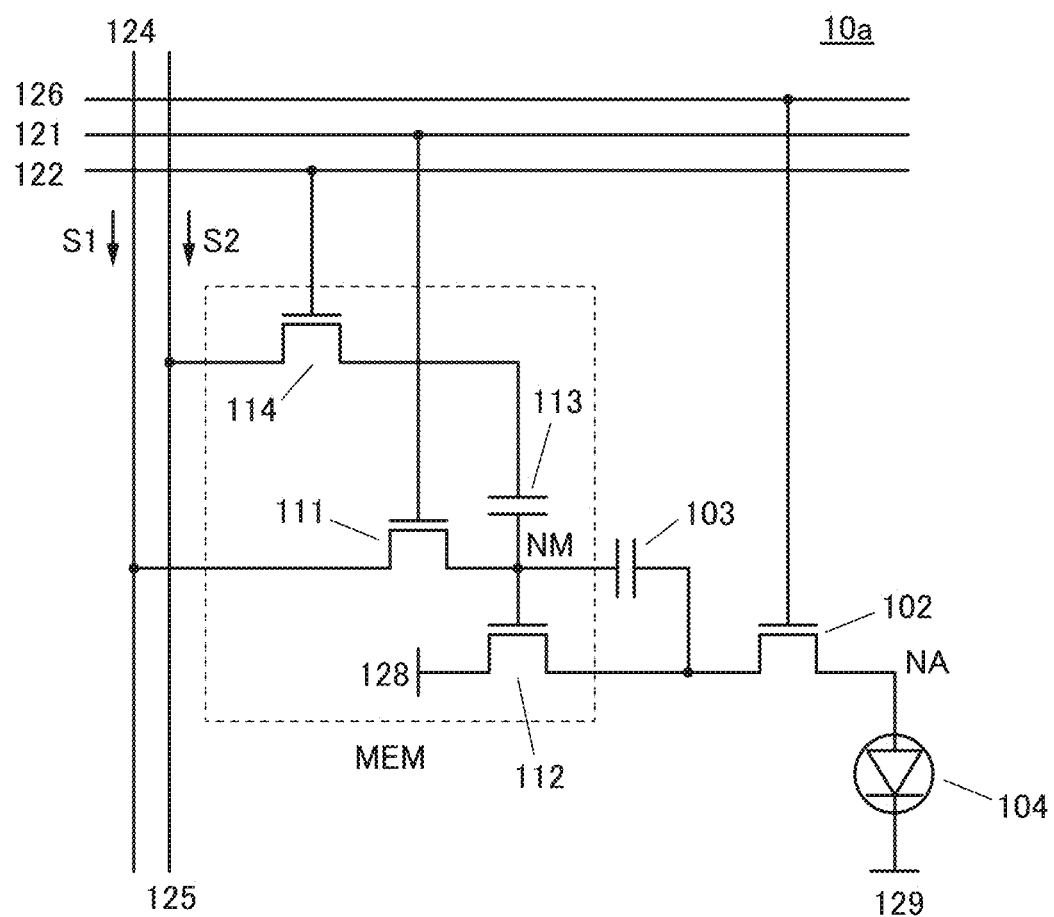
FIG. 1 illustrates a configuration example of a pixel circuit.

Embodiments will be described in detail with reference to the drawings. It will be readily appreciated by those skilled in the art that modes and details of the present invention can be modified in various ways without departing from the spirit and scope of the present invention. Therefore, the present invention should not be interpreted as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

In this specification and the like, ordinal numbers such as "first," "second," and "third" are used to avoid confusion among components in some cases, and the terms do not limit the components numerically or do not limit the order.

Note that in this specification and the like, the term "electrically connected" includes the case where components are connected through an object having any electric function. Here, there is no particular limitation on the "object having any electric function" as long as electric signals can be transmitted and received between components that are connected through the object. Examples of the "object having any electric function" are a switching element such as a transistor, a resistor, a coil, a capacitor, and an element with a variety of functions as well as an electrode and a wiring.

Embodiment 1

In this embodiment, a display device of one embodiment of the present invention will be described with reference to the drawings.

One embodiment of the present invention is a display device that has a function of supplying a first image signal to a pixel and adding a second image signal to the first image signal. Note that the first image signal and the second image signal can be generated by a circuit provided outside the pixel, such as a source driver. Each pixel is provided with a memory circuit in which the first image signal is retained.

After that, the second image signal is added to the memory circuit in which the first image signal is retained, and the combined image signal is supplied to a display element. Therefore, an image corresponding to the first image signal and an image corresponding to the second image signal can be superimposed on each other and displayed by the display element. Thus, the display device can display an image corresponding to the image signal having a potential higher than the potential that can be generated by the source driver and the like. Accordingly, the display device can display a high-luminance image as compared with the case where an image corresponding to only one image signal is displayed without addition of another image signal; thus, the dynamic range of the display device can be increased. Furthermore, the potential of the image signal generated by the source driver and the like can be decreased, and thus the power consumption of the display device can be reduced.

In this specification and the like, the terms "first image signal" and "second image signal" can be interchanged with each other as necessary or as appropriate.

Configuration Example of Pixel Circuit

FIG. 1 illustrates a pixel 10a that can be used for a display device of one embodiment of the present invention. The pixel 10a includes a transistor 102, a transistor 111, a transistor 112, a transistor 114, a capacitor 103, a capacitor 113, and an EL element 104.

One of a source and a drain of the transistor 111 is electrically connected to one electrode of the capacitor 113. One of a source and a drain of the transistor 114 is electrically connected to the other electrode of the capacitor 113. The one electrode of the capacitor 113 is electrically connected to a gate of the transistor 112. The gate of the transistor 112 is electrically connected to one electrode of the capacitor 103. One of a source and a drain of the transistor 112 is electrically connected to the other electrode of the capacitor 103. The other electrode of the capacitor 103 is electrically connected to one of a source and a drain of the transistor 102. The other of the source and the drain of the transistor 102 is electrically connected to one electrode of the EL element 104.

Here, a wiring where the one of the source and the drain of the transistor 111, the one electrode of the capacitor 113, the gate of the transistor 112, and the one electrode of the capacitor 103 are connected is referred to as a node NM. A wiring where the other of the source and the drain of the transistor 102 and the one electrode of the EL element 104 are connected is referred to as a node NA.

A gate of the transistor 111 is electrically connected to a wiring 121. A gate of the transistor 114 is electrically connected to a wiring 122. A gate of the transistor 102 is electrically connected to a wiring 126. The other of the source and the drain of the transistor 111 is electrically connected to a wiring 124. The other of the source and the drain of the transistor 114 is electrically connected to a wiring 125.

The other of the source and the drain of the transistor 112 is electrically connected to a power supply line 128 (at high potential). The other electrode of the EL element 104 is electrically connected to a common wiring 129. Note that a given potential can be supplied to the common wiring 129.

The wirings 121, 122, and 126 each have a function of a scan line for controlling the operation of the corresponding transistor. The wiring 124 has a function of a signal line for supplying an image signal S1. The wiring 125 has a function of a signal line for supplying an image signal S2. Note that the image signals S1 and S2 can be generated by a circuit provided outside the pixel 10a, such as a source driver (not illustrated in FIG. 1).

The transistor 111, the transistor 112, the capacitor 113, and the transistor 114 form a memory circuit MEM. Note that the transistor 114 is not necessarily included in the memory circuit MEM.

The node NM is a storage node; when the transistor 111 is turned on, a signal supplied to the wiring 124 can be written to the node NM. The use of a transistor with an extremely low off-state current as the transistor 111 enables the potential of the node NM to be retained for a long time. As the transistor, a transistor using a metal oxide in its channel formation region (hereinafter referred to as an OS transistor) can be used, for example.

Note that an OS transistor may be used as other transistors included in the pixel as well as the transistor 111. Moreover, a transistor containing Si in its channel formation region (hereinafter referred to as a Si transistor) may be used as the transistor 111. Alternatively, an OS transistor may be used as some of the transistors included in the pixel and a Si transistor may be used as the other transistors. Examples of the Si transistor include a transistor containing amorphous silicon, a transistor containing crystalline silicon (typically, low-temperature polysilicon), and a transistor containing single crystal silicon.

In the case where an EL element is used as a display element, a silicon substrate can be used, and a Si transistor and an OS transistor can be formed to have a region where the transistors are overlapped each other. Thus, the pixel density can be increased even when the number of transistors is relatively large.

As a semiconductor material used for an OS transistor, a metal oxide having an energy gap of 2 eV or more, preferably 2.5 eV or more, further preferably 3 eV or more can be used. A typical example is an oxide semiconductor containing indium, and a CAAC-OS or a CAC-OS described later can be used, for example. A CAAC-OS has a crystal structure formed of stable atoms, and thus is suitable for a transistor or the like that is required to have high reliability. In addition, a CAC-OS exhibits high mobility characteristics and thus is suitable for a transistor or the like that is driven at high speed.

An OS transistor has a large energy gap and thus exhibits extremely low off-state current characteristics. Furthermore, an OS transistor has the following feature different from that of a Si transistor: impact ionization, avalanche breakdown, short-channel effects, and the like do not occur. Thus, an OS transistor enables formation of a highly reliable circuit.

A semiconductor layer included in an OS transistor can be, for example, an oxide film represented by In-M-Zn that contains indium, zinc, and M (a metal such as aluminum, titanium, gallium, germanium, yttrium, zirconium, lanthanum, cerium, tin, neodymium, or hafnium).

In the case where an oxide semiconductor included in the semiconductor layer is an In-M-Zn-based oxide, the atomic ratio among the metal elements of a sputtering target used to deposit the In-M-Zn-based oxide preferably satisfies In≥M and Zn≥M. The atomic ratio among the metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio among the metal elements in the formed semiconductor layer varies from the above atomic ratio among the metal elements of the sputtering target in a range of ±40%.

An oxide semiconductor with a low carrier density is used for the semiconductor layer. For example, the semiconductor layer can be formed using an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low density of defect states and can thus be regarded as having stable characteristics.

Note that without limitation to the compositions and materials described above, a material with an appropriate composition can be used depending on required semiconductor characteristics and electric characteristics (e.g., field-effect mobility and threshold voltage) of a transistor. Moreover, in order to obtain the required semiconductor characteristics of the transistor, the carrier density, impurity concentration, defect density, atomic ratio of a metal element to oxygen, interatomic distance, density, and the like of the semiconductor layer are preferably set to appropriate values.

When the oxide semiconductor included in the semiconductor layer contains silicon or carbon, which is one of elements belonging to Group 14, the number of oxygen vacancies is increased in the semiconductor layer and the semiconductor layer becomes n-type. Thus, the concentration of silicon or carbon (measured by secondary ion mass spectrometry) in the semiconductor layer is lower than or equal to $2 \times 10^{18}$ atoms/cm$^3$, preferably lower than or equal to $2 \times 10^{17}$ atoms/cm$^3$.

An alkali metal and an alkaline earth metal might generate carriers when bonded to an oxide semiconductor, in which case the off-state current of the transistor might be increased. For that reason, the concentration of an alkali metal or an alkaline earth metal (measured by secondary ion mass spectrometry) in the semiconductor layer is lower than or equal to $1 \times 10^{18}$ atoms/cm$^3$, preferably lower than or equal to $2 \times 10^{16}$ atoms/cm$^3$.

When the oxide semiconductor included in the semiconductor layer contains nitrogen, electrons serving as carriers are generated and the carrier density increases, so that the semiconductor layer easily becomes n-type. Consequently, a transistor including an oxide semiconductor that contains nitrogen is likely to have normally-on characteristics. Thus, the concentration of nitrogen (measured by secondary ion mass spectrometry) in the semiconductor layer is preferably lower than or equal to $5 \times 10^{18}$ atoms/cm$^3$.

The semiconductor layer may have a non-single-crystal structure, for example. The non-single-crystal structure includes a CAAC-OS (c-axis aligned crystalline oxide semiconductor) including a c-axis aligned crystal, a polycrystalline structure, a microcrystalline structure, or an amorphous structure, for example. Among the non-single-crystal structures, an amorphous structure has the highest density of defect states, whereas the CAAC-OS has the lowest density of defect states.

An oxide semiconductor film with an amorphous structure has, for example, disordered atomic arrangement and no crystalline component. An oxide film with an amorphous structure has, for example, a completely amorphous structure and no crystal part.

Note that the semiconductor layer may be a mixed film including two or more of the following: a region with an amorphous structure, a region with a microcrystalline structure, a region with a polycrystalline structure, a CAAC-OS region, and a region with a single crystal structure. The mixed film has, for example, a single-layer structure or a stacked-layer structure including two or more of the above-mentioned regions in some cases.

A structure of a cloud-aligned composite oxide semiconductor (CAC-OS), which is one embodiment of a non-single-crystal semiconductor layer, is described below.

The CAC-OS has, for example, a composition in which elements contained in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to the element M in a second region, the first region has a higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

Meanwhile, the CAC-OS relates to the material composition of an oxide semiconductor. In a material composition of a CAC-OS including In, Ga, Zn, and O, nanoparticle regions including Ga as a main component are observed in a part of the CAC-OS and nanoparticle regions including In as a main component are observed in another part thereof. These nanoparticle regions are randomly dispersed to form a mosaic pattern. Therefore, the crystal structure is a secondary element for the CAC-OS.

Note that in the CAC-OS, a stacked-layer structure including two or more films with different compositions is not included. For example, a two-layer structure of a film including In as a main component and a film including Ga as a main component is not included.

Note that a boundary between the region including GaO$_{X3}$ as a main component and the region including In$_{X2}$Zn$_{Y2}$O$_{Z2}$ or InO$_{X1}$ as a main component is not clearly observed in some cases.

In the case where one or more kinds of elements selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in a part of the CAC-OS and nanoparticle regions including In as a main component are observed in another part thereof, and these nanoparticle regions are randomly dispersed to form a mosaic pattern in the CAC-OS.

The CAC-OS can be formed by a sputtering method under conditions where intentional heating is not performed on a substrate, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the ratio of the flow rate of an oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, the x-ray diffraction measurement shows no alignment in the a-b plane direction and the c-axis direction in a measured region.

In an electron diffraction pattern of the CAC-OS that is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which the metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

Here, the conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, a high field-effect mobility (μ) can be achieved.

By contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and a high field-effect mobility (μ) can be achieved.

Furthermore, a semiconductor element using a CAC-OS has high reliability. Thus, the CAC-OS is suitably used as a material for a variety of display devices and the like.

In the pixel 10a, the image signal S1 written to the node NM is capacitively coupled with the image signal S2 supplied from the wiring 125 and the capacitively coupled image signal can be output to the node NA. Note that the transistor 114 has a function of selecting a pixel. The transistor 102 functions as a switch that controls light emission from the EL element 104.

For example, in the case where the potential of the image signal S1 is higher than the threshold voltage ($V_{th}$) of the transistor 112, the transistor 112 is turned on before the image signal S2 is written, and thus, the EL element 104 emits light. For this reason, it is preferable that the transistor 102 be provided and be turned on after the potential of the node NM is fixed so that the EL element 104 emit light.

That is, when the image signal S1 is stored in the node NM, the image signal S2 can be added to the image signal S1. Due to the withstand voltage and the like of the source driver that generates an image signal, there is an upper limit on the level of the potential of the image signal. In view of this, two image signals are combined, whereby the display device can display an image corresponding to the image signal having a potential higher than the potential that can be output from the source driver and the like. Accordingly, the display device can display a high-luminance image as compared with the case where an image corresponding to only one image signal is displayed without addition of another image signal; thus, the dynamic range of the display device can be increased. Furthermore, the potential of the image signal generated by the source driver and the like can be decreased, and thus the power consumption of the display device can be reduced.

Operation Example of Pixel Circuit

An operation example of the pixel 10a will be described in detail with reference to timing charts shown in FIGS. 2A and 2B. In the following description, a potential VDD represents a high potential and a potential VSS represents a low potential. Here, the potential VSS can be set to, for example, a ground potential. Although a potential $V_{S1}$ of the image signal S1, which is supplied to the wiring 124, can be a given positive or negative potential, the case where the potential $V_{S1}$ is higher than the potential VSS is described here.

First, an operation of writing the image signal S1 to the node NM is described with reference to FIG. 2A.

At Time T1, potentials of the wirings 121, 122, and 126 are set to the potential VSS. A potential of the wiring 125 is set to a potential $V_{o1}$ that is lower than the potential VSS. The potential $V_{o1}$ can be, for example, a negative potential. Note that in this specification and the like, the potential $V_{o1}$ is referred to as a reference potential in some cases.

At Time T2, the potential of the wiring 122 is set to the potential VDD. Accordingly, the transistor 114 is turned on, so that the potential of the other electrode of the capacitor 113 becomes the potential $V_{o1}$. In addition, the potential of the node NM becomes a potential $V_{ol}'$ that corresponds to the potential $V_{ol}$. Here, the potential $V_{ol}'$ changes depending on the ratio of the capacitance value of the capacitor 113 to that of the capacitor 103.

At Time T3, the potential of the wiring 121 is set to the potential VDD. Accordingly, the transistor 111 is turned on, so that the potential $V_{S1}$ of the wiring 124 is written to the node NM.

At Time T4, the potential of the wiring 121 is set to the potential VSS. Accordingly, the transistor 111 is turned off, so that the potential $V_{S1}$ is retained in the node NM.

At Time T5, the potential of the wiring 122 is set to the potential VSS. Accordingly, the transistor 114 is turned off. Thus, the operation of writing the image signal S1 is completed.

Next, an operation of adding the image signal S2 and an operation of making the EL element 104 emit light will be described with reference to FIG. 2B. Note that a potential of the image signal S2 is referred to as a potential $V_{S2}$. Although the potential $V_{S2}$ of the image signal S2, which is supplied to the wiring 125, can be a given positive or negative potential, the case where the potential $V_{S2}$ is higher than the potential VSS is described here.

At Time T11, the potential of the wiring 122 is set to the potential VDD. Accordingly, the transistor 114 is turned on, so that a potential $V_{NM}$ of the node NM becomes a value expressed by the following formula. Here, $C_1$ represents the capacitance value of the capacitor 113 and $C_2$ represents the capacitance value of the capacitor 103.

[Formula 1]
$$V_{NM} = \frac{C_1(V_{s1} + V_{s2} - V_{ol}) + C_2 V_{s1}}{C_1 + C_2} \quad (1)$$

That is, the potential $V_{NM}$ depends on a ratio of the capacitance value $C_1$ to the capacitance value $C_2$ ($C_1/C_2$), and does not depend on the capacitance value $C_1$ and the capacitance value $C_2$ themselves. Here, when the potential $V_{ol}$ is a negative potential, the formula 1 can be modified as below.

[Formula 2]
$$V_{NM} = \frac{C_1(V_{s1} + V_{s2} + |V_{ol}|) + C_2 V_{s1}}{C_1 + C_2} \quad (2)$$

Therefore, the potential $V_{NM}$ increases as the ratio $C_1/C_2$ increases. In the case where the capacitance value $C_2$ is negligibly small as compared with the capacitance value $C_1$, the potential $V_{NM}$ is expressed by the following formula. Note that the potential $V_{ol}'$ is equal to the potential $V_{ol}$ in this case.

[Formula 3]
$$V_{NM} = V_{s1} + V_{s2} - V_{ol} \quad (3)$$

In other words, the potential $V_{NM}$ corresponds to the sum of the potentials $V_{S1}$ and $V_{S2}$. Therefore, the ratio $C_1/C_2$ is preferably large. For example, the ratio $C_1/C_2$ is preferably larger than 1, further preferably larger than or equal to 2, and still further preferably larger than or equal to 3. However, when the ratio $C_1/C_2$ is too large, the capacitance value $C_2$ with respect to the pixel area of the pixel 10a is small and sufficient capacitance value $C_2$ cannot be obtained; thus, the ratio $C_1/C_2$ is preferably less than or equal to 10, further preferably less than or equal to 5.

Note that due to the influence of parasitic capacitance caused by the gate capacitance and the like of the transistor 112, the potential $V_{NM}$ is lower than the value calculated in accordance with the above formulae 1 to 3, in some cases.

At Time T12, the potential of the wiring 122 is set to the potential VSS. Accordingly, the transistor 114 is turned off, so that the potential of the node NM is determined.

At Time T13, the potential of the wiring 126 is set to the potential VDD, so that the transistor 102 is turned on; accordingly, the potential of the node NA becomes a potential corresponding to that of the node NM, whereby the EL element 104 emits light.

The above is the operation example of the pixel 10a. As described above, one embodiment of the present invention is the operation method of the display device in which after the potential of the wiring 125 is set to the potential $V_{ol}$ that is a reference potential, the image signal S1 is written to the node NM, and then the image signal S2 is added to the image signal S1, so that the EL element 104 emits light.

Note that the operation shown in FIG. 2A and the operation shown in FIG. 2B can be alternately performed; however, one embodiment of the present invention is not limited thereto. For example, the potential of the node NM can be retained for a long time when the transistor 111 is an OS transistor, in which case the operation shown in FIG. 2B may be performed a plurality of times after the operation shown in FIG. 2A is performed once.

Here, the potential of the node NM at Time T11 (shown in FIG. 2B) at which the image signal S2 is added depends on the potential $V_{ol}$, as shown in Formula 1 or the like. The potential $V_{NM}$ increases as the potential $V_{ol}$ decreases, and so does the luminance of the EL element 104. That is, the display device of one embodiment of the present invention can display a higher-luminance image as the potential $V_{ol}$ is lower. Therefore, for example, the potential $V_{ol}$ preferably changes in accordance with the illuminance of external light. For example, the display device of one embodiment of the present invention is preferably provided with an illuminance sensor to measure the illuminance of external light.

FIG. 3A1 illustrates an outdoor scene at daytime on a sunny day, and FIG. 3B1 illustrates an outdoor scene at night. A display device 200 illustrated in FIGS. 3A1 and 3B1 is a display device of one embodiment of the present invention.

FIG. 3A2 shows the potential of the wiring 125 of the display device 200 in the environment illustrated in FIG. 3A1 from Time T1 to Time T2 shown in FIG. 2A. FIG. 3B2 illustrates the potential of the wiring 125 of the display device 200 in the environment illustrated in FIG. 3B1 from Time T1 to Time T2 shown in FIG. 2A. Here, the potential $V_{ol}$ shown in FIG. 3A2 is referred to as a potential $V_{ol}[1]$ and the potential $V_{ol}$ shown in FIG. 3B2 is referred to as a potential $V_{ol}[2]$.

The illuminance of external light in the environment illustrated in FIG. 3A1 is higher than that of external light in the environment illustrated in FIG. 3B1. Thus, in the environment illustrated in FIG. 3A1, the potential $V_{ol}$ is preferably set lower than that in the environment illustrated in FIG. 3B1 to display a higher-luminance image on the display device 200. Accordingly, the visibility of the image displayed on the display device 200 can be increased. Furthermore, the luminance of the image displayed on the display device 200 is decreased in the environment illustrated in FIG. 3B1, whereby the power consumption of the display device 200 can be reduced.

Figure 4:
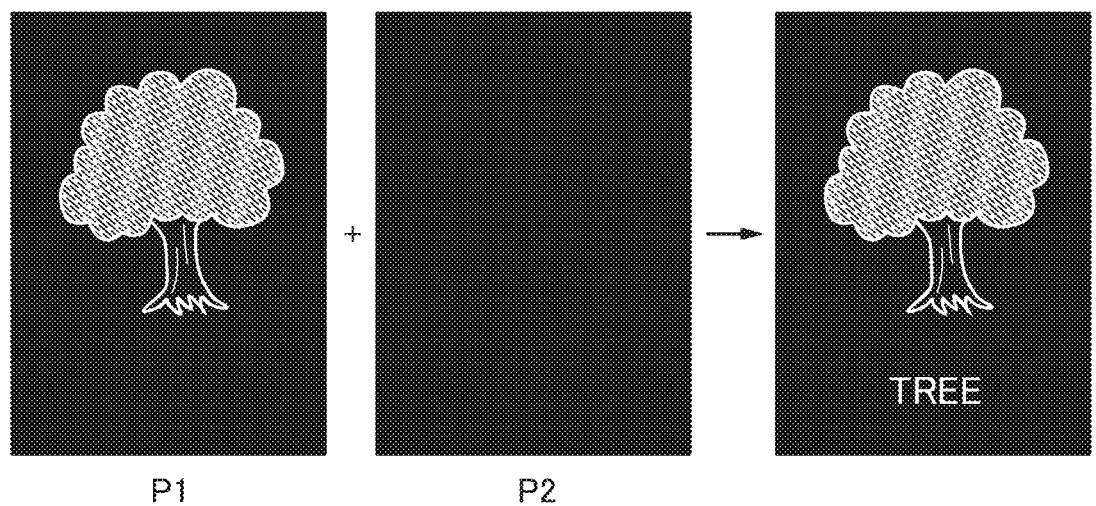
FIG. 4 illustrates an operation example of a display device.

Note that the image corresponding to the image signal S1 and the image corresponding to the image signal S2 may be different. FIG. 4 shows the case where an image P1 corresponding to the image signal S1 includes a drawing and letters, and an image P2 corresponding to the image signal S2 includes only letters. In this case, when the image P1 and the image P2 are superimposed on each other, the luminance of the letters can be increased, whereby the letters can be emphasized, for example. As shown in FIGS. 2A and 2B, in the case where the potential $V_{S1}$ of the image signal S1 is rewritten, the potential $V_{S2}$ of the image signal S2 also needs to be rewritten. Meanwhile, in the case where the potential $V_{S2}$ of the image signal S2 is rewritten, the potential $V_{S1}$ of the image signal S1 need not be rewritten as long as the charge written to the node NM at Time T3 (shown in FIG. 2A) is retained in the node NM without being leaked through the transistor 111 and the like. Therefore, in the case illustrated in FIG. 4, the luminance of the letters can be controlled by adjusting the value of the potential $V_{S2}$.

Here, as described above, when the potential $V_{S1}$ of the image signal S1 is rewritten, the potential $V_{S2}$ of the image signal S2 also needs to be rewritten, whereas when the potential $V_{S2}$ of the image signal S2 is rewritten, the potential $V_{S1}$ of the image signal S1 need not be rewritten. Therefore, it is preferable that the image P1 be rewritten less frequently than the image P2. Note that the image P1 is not limited to an image including a drawing and letters, and the image P2 is not limited to an image including only letters.

Structure Example of Display Device

FIG. 5 is a block diagram illustrating a structure example of a display device of one embodiment of the present invention. The display device includes a pixel array in which pixels 10 are arranged in a matrix, a gate driver 12, a source driver 13, an illuminance sensor 14, and demultiplexers 15. As the pixel 10, the pixel 10a described above can be used. Note that the number of demultiplexers 15 can be equal to the number of columns of the pixels 10 arranged in the pixel array, for example. Moreover, the source driver 13 and the demultiplexers 15 may be collectively referred to as a source driver. In other words, the demultiplexers 15 may be included in the source driver.

For the gate driver 12 and the source driver 13, a shift register circuit can be used, for example. The gate driver 12 is electrically connected to the pixels 10 through the wirings 121, 122, and 126. The illuminance sensor 14 is electrically connected to the source driver 13. The source driver 13 is electrically connected to input terminals of the demultiplexers 15. First output terminals of the demultiplexers 15 are electrically connected to the pixels 10 through the wirings 124. Second output terminals of the demultiplexers 15 are electrically connected to the pixels 10 through the wirings 125.

The gate driver 12 has a function of generating a signal for controlling the operation of transistors included in the pixel 10. The source driver 13 has a function of generating the image signals S1 and S2. Furthermore, the source driver 13 has a function of generating the potential $V_{ol}$ that is a reference potential. Note that the potential $V_{ol}$ may be generated by a circuit other than the source driver.

The demultiplexer 15 has a function of supplying the image signal S1 and the image signal S2 to the wiring 124 and the wiring 125, respectively. Furthermore, in the case where the source driver 13 has a function of generating the potential $V_{ol}$, the demultiplexer 15 has a function of supplying the potential $V_{ol}$ to the wiring 125.

The illuminance sensor 14 has a function of measuring the illuminance of external light. As described above, in the display device of one embodiment of the present invention, the potential $V_{ol}$ can be adjusted in accordance with the illuminance of external light. Thus, the illuminance sensor 14 measures the illuminance of external light and supplies information on the measured illuminance to the source driver 13, whereby the source driver 13 can generate the potential $V_{ol}$ corresponding to the illuminance of external light. Note that in the case where the source driver 13 does not have a function of generating the potential $V_{ol}$, a structure in which the illuminance sensor 14 is not electrically connected to the source driver 13 can be employed.

Note that the illuminance sensor 14 can include a photoelectric conversion element. As the photoelectric conversion element, a photoelectric conversion element containing silicon in its photoelectric conversion layer or a photoelectric conversion element containing a selenium-based material in its photoelectric conversion layer can be used, for example.

The photoelectric conversion element containing a selenium-based material has high external quantum efficiency with respect to visible light. In such a photoelectric conversion element, the amount of amplification of electrons with respect to the amount of incident light can be large owing to the avalanche multiplication. A selenium-based material has a high light-absorption coefficient, and thus enables formation of a thin photoelectric conversion layer, for example; accordingly, the use of a selenium-based material has advantages in production. A thin film of a selenium-based material can be formed by a vacuum evaporation method, a sputtering method, or the like.

As the selenium-based material, crystalline selenium such as single crystal selenium and polycrystalline selenium, amorphous selenium, a compound of copper, indium, and selenium (CIS), a compound of copper, indium, gallium, and selenium (CIGS), or the like can be used.

Figure 6A:
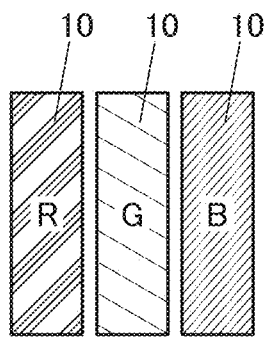
FIGS. 6A to 6E each illustrate pixels.
Figure 6B:
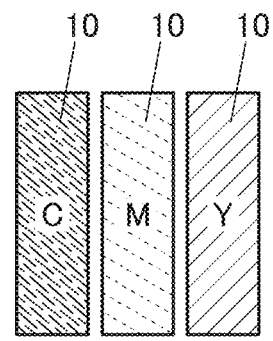

FIGS. 6A to 6E show colors exhibited by the pixels 10 provided in the display device of one embodiment of the present invention. As illustrated in FIG. 6A, the pixel 10 that exhibits red (R), the pixel 10 that exhibits green (G), and the pixel 10 that exhibits blue (B) can be provided in the display device of one embodiment of the present invention. Alternatively, as illustrated in FIG. 6B, the pixel 10 that exhibits cyan (C), the pixel 10 that exhibits magenta (M), and the pixel 10 that exhibits yellow (Y) may be provided in the display device of one embodiment of the present invention.

Figure 6C:
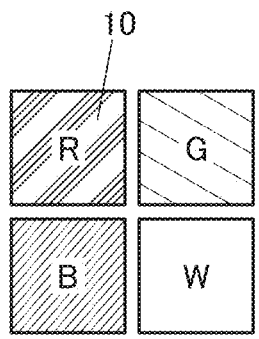
Figure 6D:
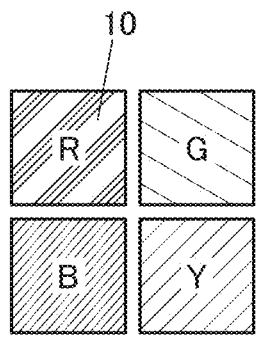

Alternatively, as illustrated in FIG. 6C, the pixel 10 that exhibits red (R), the pixel 10 that exhibits green (G), the pixel 10 that exhibits blue (B), and the pixel 10 that exhibits white (W) may be provided in the display device of one embodiment of the present invention. Alternatively, as illustrated in FIG. 6D, the pixel 10 that exhibits red (R), the pixel 10 that exhibits green (G), the pixel 10 that exhibits blue (B), and the pixel 10 that exhibits yellow (Y) may be provided in the display device of one embodiment of the present invention. Alternatively, as illustrated in FIG. 6E, the pixel 10 that exhibits cyan (C), the pixel 10 that exhibits magenta (M), the pixel 10 that exhibits yellow (Y), and the pixel 10 that exhibits white (W) may be provided in the display device of one embodiment of the present invention.

Figure 6E:
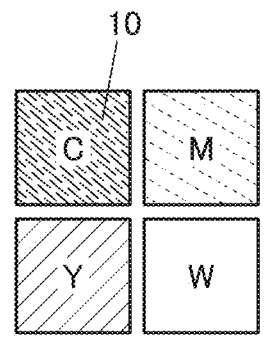

When the pixel 10 that exhibits white (W) is provided in the display device of one embodiment of the present invention as illustrated in FIGS. 6C and 6E, the luminance of the displayed image can be increased. Furthermore, when the number of colors exhibited by the pixel 10 is increased as illustrated in FIG. 6D and the like, the reproducibility of intermediate color can be increased, whereby the display quality can be improved.

Modification Example of the Pixel Circuit

Figure 7A:
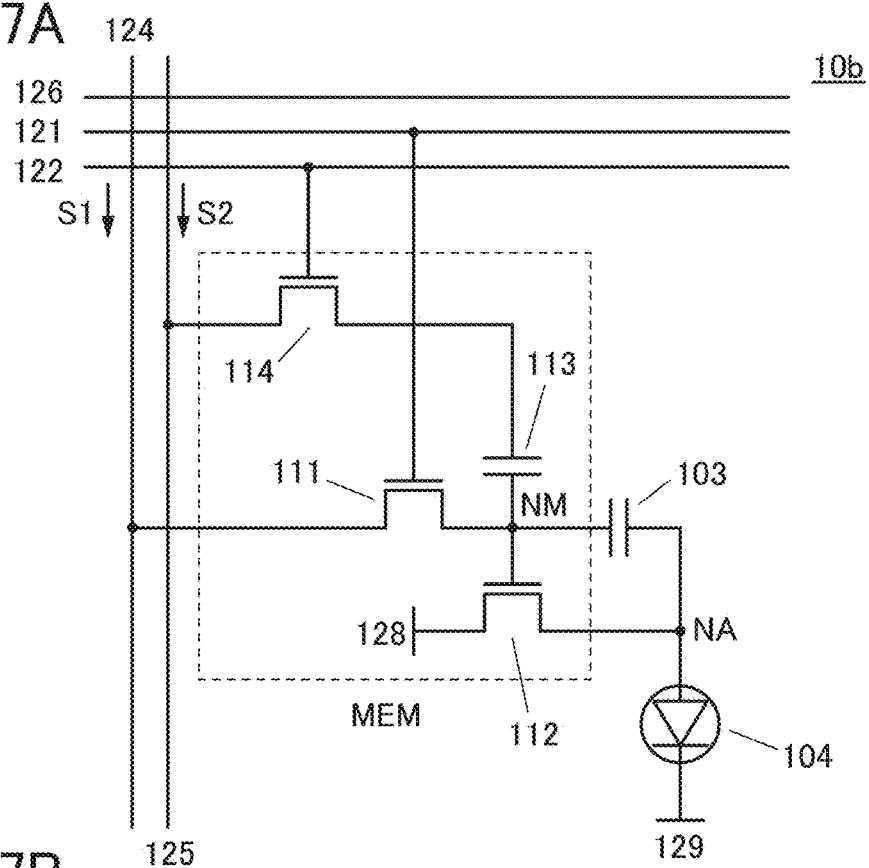
FIGS. 7A and 7B each illustrate a configuration example of a pixel circuit.

Next, a modification example of the pixel 10 is described. The pixel 10 can have a configuration of a pixel 10b shown in FIG. 7A. The pixel 10b has a configuration in which the transistor 102 is omitted from the pixel 10a.

As described above, the transistor 102 is provided to solve a malfunction that occurs in the case where the potential of the signal written to the node NM is higher than or equal to the threshold voltage ($V_{th}$) of the transistor 112. Note that when the signal written to the node NM is set lower than $V_{th}$, the transistor 102 can be omitted.

Figure 7B:
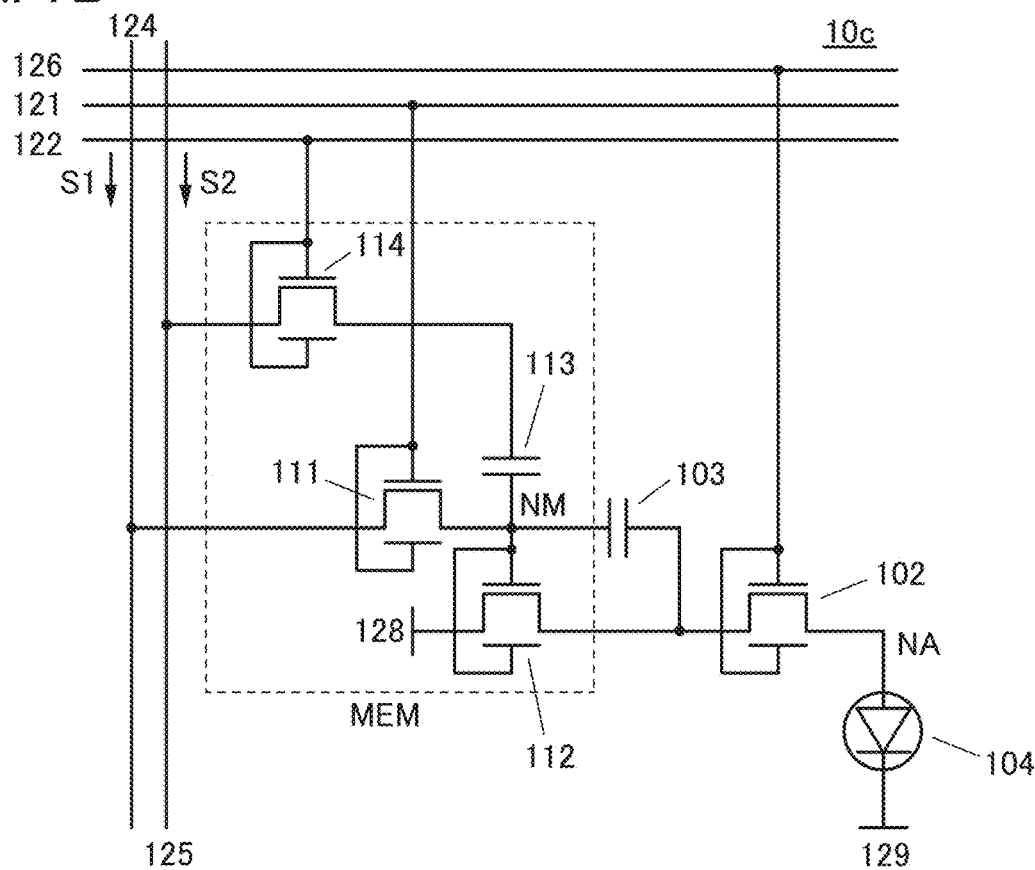

Alternatively, the pixel 10 may have a configuration of a pixel 10c illustrated in FIG. 7B. The pixel 10c has a configuration in which each transistor is provided with a back gate. The back gate is electrically connected to a corresponding front gate and thus has an effect of increasing on-state current. Alternatively, different potentials may be supplied to the back gate and the front gate. Such a configuration enables control of the threshold voltages of the transistors. Although all of the transistors have a back gate in FIG. 7B, a transistor not provided with a back gate may also be included. The transistor including a back gate is also effective for the other pixel circuits in this embodiment.

Figure 8:
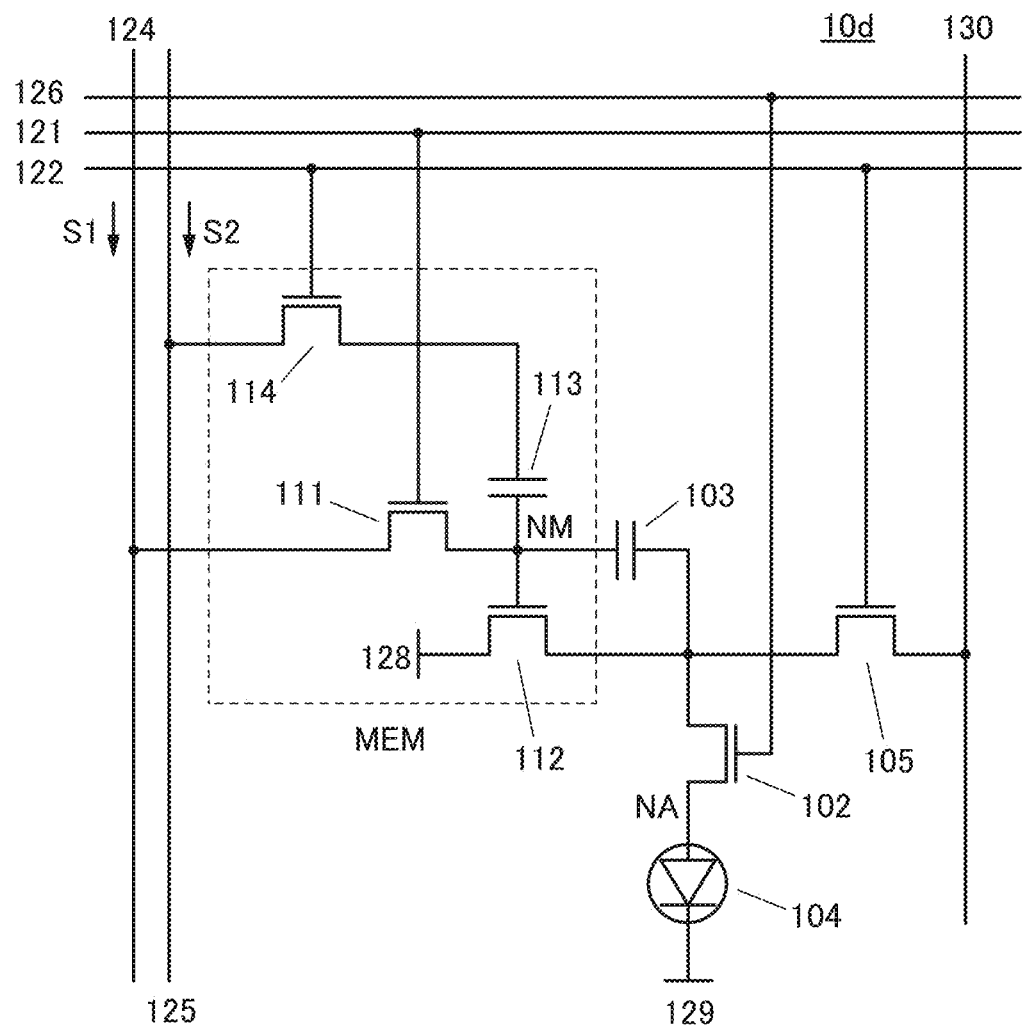
FIG. 8 illustrates a configuration example of a pixel circuit.

Alternatively, the pixel 10 may have a configuration of a pixel 10d shown in FIG. 8. The pixel 10d includes a transistor 105 and a wiring 130 in addition to the components of the pixel 10a.

One of a source and a drain of the transistor 105 is electrically connected to the one of the source and the drain of the transistor 112. The other of the source and the drain of the transistor 105 is electrically connected to the wiring 130. A gate of the transistor 105 is electrically connected to the wiring 122.

The wiring 130 has a function of a power supply line. While the image signal S1 is written to the pixel 10d and while the image signal S2 is written to the pixel 10d, a predetermined potential such as a low potential is supplied from the wiring 130 to the other electrode of the capacitor 103 through the transistor 105, whereby writing of the image signals can be performed stably.

This embodiment can be implemented in an appropriate combination with any of the structures described in the other embodiments and the like.

Embodiment 2

In this embodiment, structure examples of a display device including an EL element will be described.

Figure 9A:
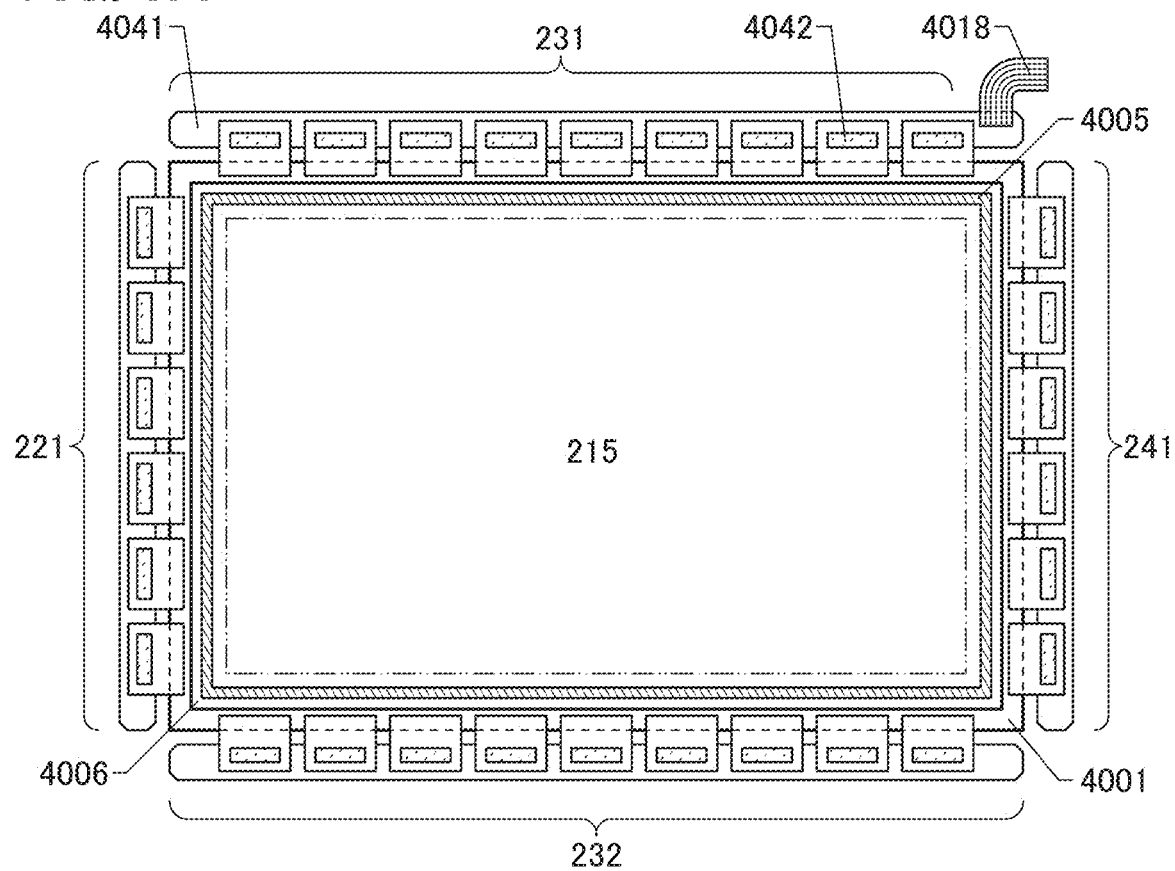
FIGS. 9A and 9B each illustrate a structure example of a display device.

In FIG. 9A, a sealant 4005 is provided to surround a display portion 215 provided over a first substrate 4001, and the display portion 215 is sealed with the sealant 4005 and a second substrate 4006.

A pixel array including the pixels described in Embodiment 1 is provided in the display portion 215.

In FIG. 9A, a scan line driver circuit 221, a signal line driver circuit 231, a signal line driver circuit 232, and a common line driver circuit 241 each include a plurality of integrated circuits 4042 provided over a printed circuit board 4041. The integrated circuits 4042 are each formed using a single crystal semiconductor or a polycrystalline semiconductor. The signal line driver circuit 231 and the signal line driver circuit 232 each have a function of the source driver described in Embodiment 1. The scan line driver circuit 221 has a function of the gate driver described in Embodiment 1. The common line driver circuit 241 has a function of supplying a predetermined potential to the common wiring described in Embodiment 1.

Signals and potentials are supplied to the scan line driver circuit 221, the common line driver circuit 241, the signal line driver circuit 231, and the signal line driver circuit 232 through a flexible printed circuit (FPC) 4018.

The integrated circuits 4042 included in the scan line driver circuit 221 and those included in the common line driver circuit 241 each have a function of supplying a selection signal to the display portion 215. The integrated circuits 4042 included in the signal line driver circuit 231 and those included in the signal line driver circuit 232 each have a function of supplying an image signal to the display portion 215. The integrated circuits 4042 are mounted in a region different from a region surrounded by the sealant 4005 over the first substrate 4001.

Note that there is no particular limitation on the connection method of the integrated circuit 4042; a wire bonding method, a chip on glass (COG) method, a tape carrier package (TCP) method, a chip on film (COF) method, or the like can be used.

Figure 9B:
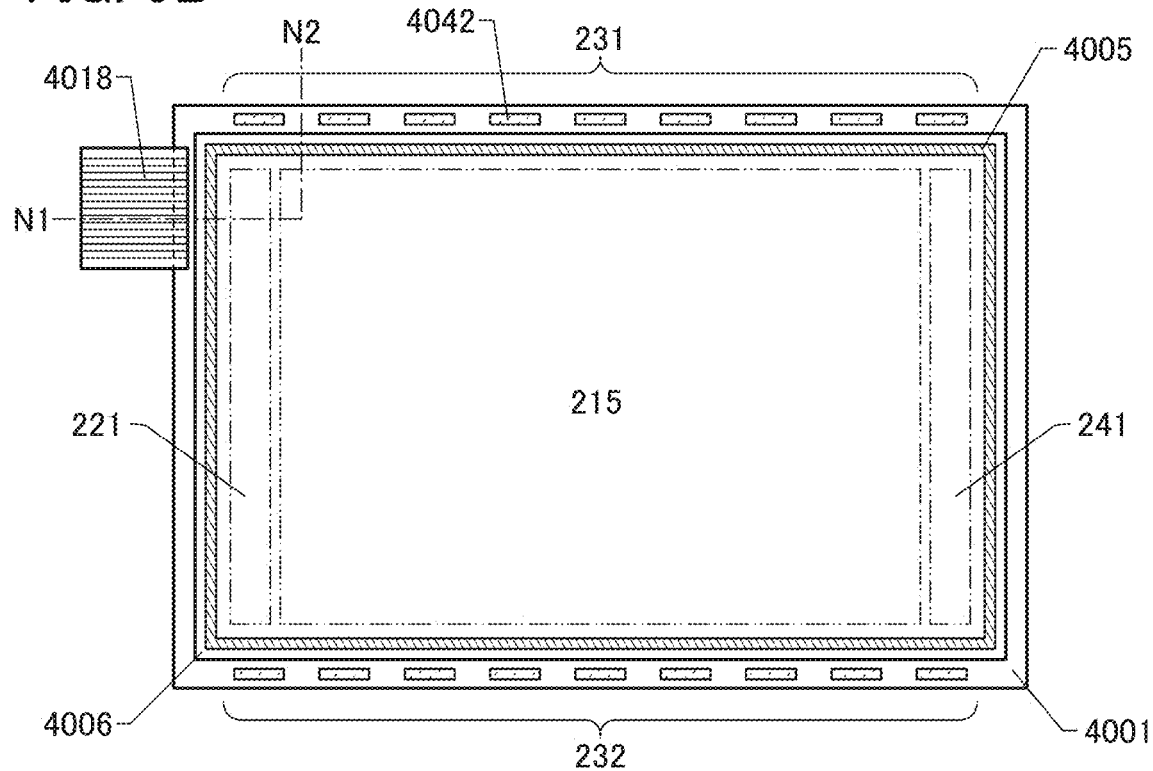

FIG. 9B shows an example of mounting the integrated circuits 4042 included in the signal line driver circuit 231 and the signal line driver circuit 232 by a COG method. Moreover, some or all of the driver circuits can be formed over the substrate where the display portion 215 is formed, whereby a system-on-panel can be obtained.

In the example shown in FIG. 9B, the scan line driver circuit 221 and the common line driver circuit 241 are formed over the substrate where the display portion 215 is formed. When the driver circuits are formed concurrently with the pixel circuit in the display portion 215, the number of components can be reduced. Accordingly, the productivity can be increased.

In FIG. 9B, the sealant 4005 is provided to surround the display portion 215, the scan line driver circuit 221, and the common line driver circuit 241 provided over the first substrate 4001. The second substrate 4006 is provided over the display portion 215, the scan line driver circuit 221, and the common line driver circuit 241. Consequently, the display portion 215, the scan line driver circuit 221, and the common line driver circuit 241 are sealed together with a display element by the first substrate 4001, the sealant 4005, and the second substrate 4006.

Although the signal line driver circuit 231 and the signal line driver circuit 232 are formed separately and mounted on the first substrate 4001 in the example shown in FIG. 9B, one embodiment of the present invention is not limited to this structure. The scan line driver circuit may be separately formed and then mounted, or part of the signal line driver circuit or part of the scan line driver circuit may be separately formed and then mounted.

In some cases, the display device encompasses a panel in which a display element is sealed, and a module in which an IC or the like including a controller is mounted on the panel.

The display portion and the scan line driver circuit over the first substrate each include a plurality of transistors. As the transistor, a transistor described below can be used, for example.

A transistor included in a peripheral driver circuit and a transistor included in the pixel circuit of the display portion may have the same structure or different structures. Transistors included in the peripheral driver circuit may have the same structure or a combination of two or more kinds of structures. Similarly, transistors included in the pixel circuit may have the same structure or may employ a combination of two or more kinds of structures.

An input device 4200 can be provided over the second substrate 4006. The display devices illustrated in FIGS. 9A and 9B and provided with the input device 4200 can each function as a touch panel.

There is no particular limitation on a sensing element (also referred to as a sensing element) included in the touch panel of one embodiment of the present invention. A variety of sensors capable of sensing the approach or contact of an object such as a finger or a stylus can be used as the sensing element.

For example, a variety of types such as a capacitive type, a resistive type, a surface acoustic wave type, an infrared type, an optical type, and a pressure-sensitive type can be used for the sensor.

In this embodiment, a touch panel including a capacitive sensing element is described as an example.

Examples of the capacitive sensing element include a surface capacitive sensing element, a projected capacitive sensing element, and the like. Examples of the projected capacitive sensing element include a self-capacitive sensing element and a mutual capacitive sensing element. The use of a mutual capacitive sensing element is preferable because multiple points can be sensed simultaneously.

The touch panel of one embodiment of the present invention can have any of a variety of structures, including a structure in which a display device and a sensing element that are separately fabricated are attached to each other and a structure in which an electrode and the like included in a sensing element are provided on one or both of a substrate supporting a display element and a counter substrate.

Figure 10A:
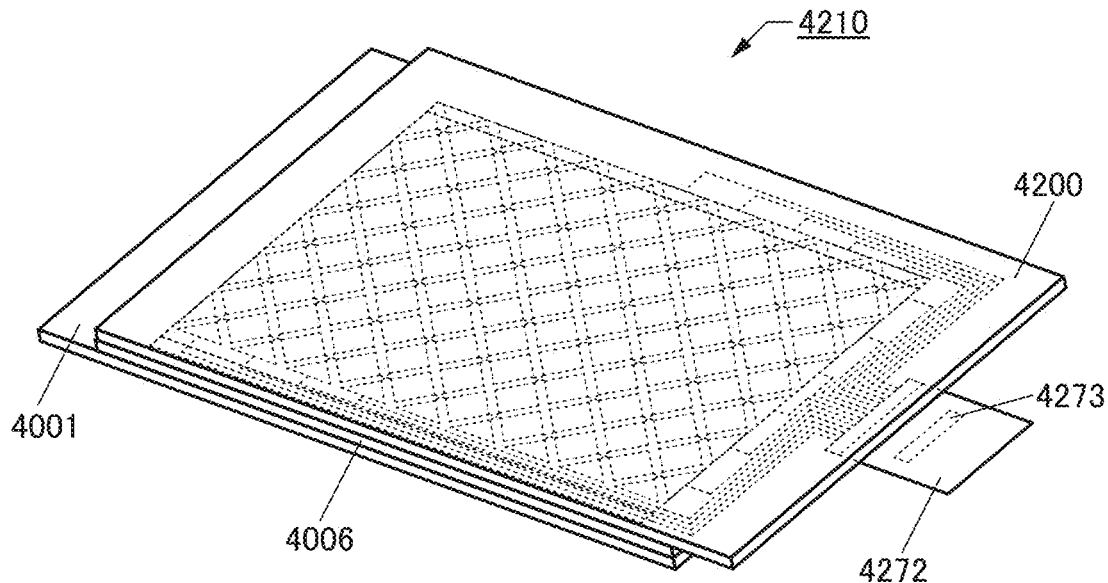
FIGS. 10A and 10B illustrate a structure example of a touch panel.
Figure 10B:
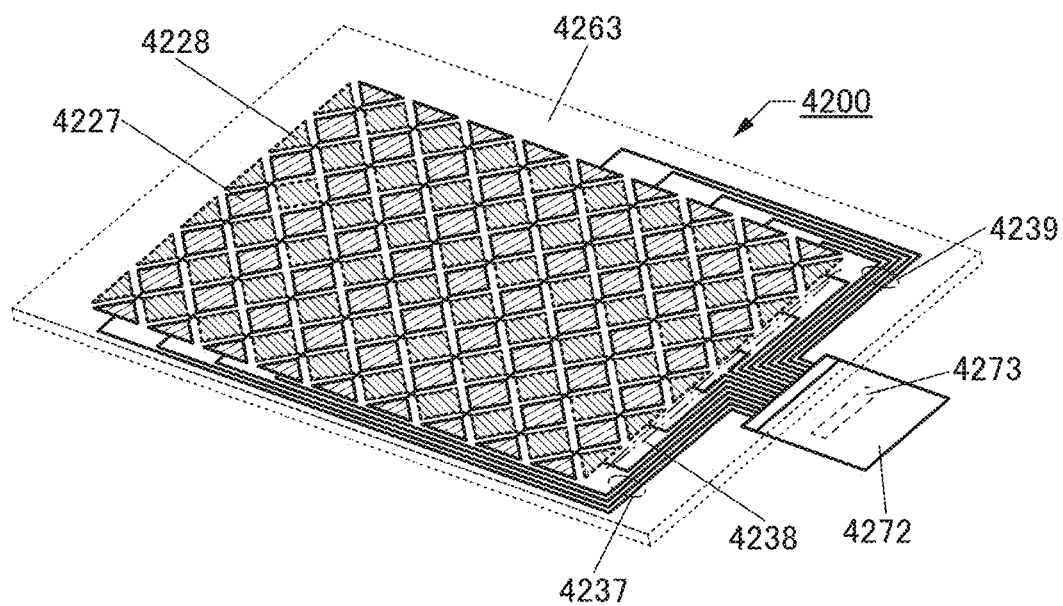

FIGS. 10A and 10B illustrate an example of the touch panel. FIG. 10A is a perspective view of a touch panel 4210. FIG. 10B is a schematic perspective view of the input device 4200. Note that for clarity, FIGS. 10A and 10B illustrate only the major components.

The touch panel 4210 has a structure in which a display device and a sensing element that are separately fabricated are attached to each other.

The touch panel 4210 includes the input device 4200 and the display device that are provided to overlap each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4238. An FPC 4272 is electrically connected to each of the plurality of wirings 4237, the plurality of wirings 4238, and the plurality of wirings 4239. An IC 4273 can be mounted on the FPC 4272.

Alternatively, a touch sensor may be provided between the first substrate 4001 and the second substrate 4006 in the display device. In the case where a touch sensor is provided between the first substrate 4001 and the second substrate 4006, an optical touch sensor including a photoelectric conversion element as well as a capacitive touch sensor may be used.

FIG. 11A is a cross-sectional view taken along a dotted line N1-N2 in FIG. 9B and illustrates a structure example of a light-emitting display device having a top-emission structure and employing a color filter method. A display device illustrated in FIG. 11A includes an electrode 4015, and the electrode 4015 is electrically connected to a terminal included in the FPC 4018 through an anisotropic conductive layer 4019. In FIG. 11A, the electrode 4015 is electrically connected to a wiring 4014 in an opening formed in insulating layers 4112, 4111, and 4110.

The electrode 4015 is formed of the same conductive layer as a first electrode layer 4030, and the wiring 4014 is formed of the same conductive layer as source and drain electrodes of transistors 4010 and 4011.

The display portion 215 and the scan line driver circuit 221 provided over the first substrate 4001 each include a plurality of transistors. In FIG. 11A, the transistor 4010 included in the display portion 215 and the transistor 4011 included in the scan line driver circuit 221 are shown as examples. In the example shown in FIG. 11A, the transistors 4010 and 4011 are bottom-gate transistors but may be top-gate transistors.

In FIG. 11A, the insulating layer 4112 is provided over the transistors 4010 and 4011. A partition wall 4510 is provided over the insulating layer 4112.

The transistor 4010 and the transistor 4011 are provided over an insulating layer 4102. The transistors 4010 and 4011 each include an electrode 4017 formed over the insulating layer 4111. The electrode 4017 can function as a back gate electrode.

The display device illustrated in FIG. 11A includes a capacitor 4020. The capacitor 4020 includes an electrode 4021 formed in the same step as a gate electrode of the transistor 4010, and an electrode formed in the same step as a source electrode and a drain electrode of the transistor 4010. The electrodes overlap each other with an insulating layer 4103 therebetween.

In general, the capacitance of a capacitor provided in a pixel portion of a display device is set in consideration of leakage current of a transistor or the like provided in the pixel portion so that charges can be held for a predetermined period. The capacitance of the capacitor can be set in consideration of off-state current of the transistor or the like.

The transistor 4010 included in the display portion 215 is electrically connected to the display element.

In the display device illustrated in FIG. 11A, an insulating layer through which impurities are less likely to pass is used as each of the insulating layers 4111 and 4103. A semiconductor layer of the transistor is sandwiched between the insulating layers 4111 and 4103, whereby entry of impurities from the outside can be prevented.

As the display element included in the display device, a light-emitting element utilizing electroluminescence (an EL element) can be used. An EL element includes a layer containing a light-emitting compound (also referred to as an "EL layer") between a pair of electrodes. When a potential difference that is greater than the threshold voltage of the EL element is generated between the pair of electrodes, holes are injected to the EL layer from the anode side and electrons are injected to the EL layer from the cathode side. The injected electrons and holes are recombined in the EL layer and a light-emitting substance contained in the EL layer emits light.

EL elements are classified depending on whether a light-emitting material is an organic compound or an inorganic compound. In general, an EL element in the former case is referred to as an organic EL element, and an EL element in the latter case is referred to as an inorganic EL element.

In an organic EL element, by voltage application, electrons are injected from one electrode to the EL layer and holes are injected from the other electrode to the EL layer. Then, the carriers (electrons and holes) are recombined, and thus, a light-emitting organic compound is excited. The light-emitting organic compound returns to a ground state from the excited state, thereby emitting light. Owing to such a mechanism, this light-emitting element is referred to as a current-excitation light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport properties), and the like.

The EL layer can be formed by an evaporation method (including a vacuum evaporation method), a transfer method, a printing method, an inkjet method, a coating method, or the like.

The inorganic EL elements are classified depending on their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions. Note that the case in which an organic EL element is used as the light-emitting element will be described here.

In order to extract light emitted from the light-emitting element, at least one of a pair of electrodes needs to be transparent. The light-emitting element that is formed over a substrate together with a transistor can have any of a top emission structure in which light emission is extracted through the surface opposite to the substrate; a bottom emission structure in which light emission is extracted through the surface on the substrate side; and a dual emission structure in which light emission is extracted through both sides.

FIG. 11A shows an example of a light-emitting display device using a light-emitting element as a display element (also referred to as an "EL display device"). A light-emitting element 4513 that is a display element is electrically connected to the transistor 4010 provided in the display portion 215. The light-emitting element 4513 can be an element that emits white light. The structure of the light-emitting element 4513 is the stacked-layer structure of the first electrode layer 4030, a light-emitting layer 4511, and a second electrode layer 4031; however, one embodiment of the present invention is not limited to this structure. The structure of the light-emitting element 4513 can be changed as appropriate in accordance with the direction of light extraction from the light-emitting element 4513, or the like.

The partition wall 4510 is formed using an organic insulating material or an inorganic insulating material. It is particularly preferable that the partition wall 4510 be formed using a photosensitive resin material to have an opening over the first electrode layer 4030 so that a side surface of the opening slopes with continuous curvature.

The light-emitting layer 4511 may be formed using either a single layer or a plurality of layers stacked.

Note that the light-emitting layer 4511 may contain an inorganic compound such as quantum dots. For example, when used for the light-emitting layer, the quantum dots can function as a light-emitting material.

A protective layer may be formed over the second electrode layer 4031 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space that is enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification so that the light-emitting element is not exposed to the outside air, in this manner.

As the filler 4514, an ultraviolet curable resin or a thermosetting resin can be used as well as an inert gas such as nitrogen or argon; for example, polyvinyl chloride (PVC), an acrylic resin, a polyimide resin, an epoxy-based resin, a silicone-based resin, polyvinyl butyral (PVB), ethylene vinyl acetate (EVA), or the like can be used. A drying agent may be contained in the filler 4514.

A glass material such as a glass frit or a resin material such as a resin that is curable at room temperature (e.g., a two-component-mixture-type resin), a light curable resin, or a thermosetting resin can be used for the sealant 4005. A drying agent may be contained in the sealant 4005.

The display device illustrated in FIG. 11A includes a coloring layer 4301 and a light-blocking layer 4302. The coloring layer 4301 has a region overlapping the light-emitting element 4513 with the filler 4514 therebetween, and the light-blocking layer 4302 has a region overlapping the partition wall 4510 with the filler 4514 therebetween.

The coloring layer 4301 is a colored layer that transmits light in a specific wavelength range. For example, a color filter for transmitting red, green, blue, cyan, magenta, or yellow light can be used. Examples of a material that can be used for the coloring layer 4301 include a metal material, a resin material, and a resin material containing pigment or dye.

The coloring layer 4301 is provided between adjacent light-blocking layers 4302. The light-blocking layer 4302 has a function of blocking light emitted from the light-emitting element 4513 and inhibiting color mixture between adjacent light-emitting elements 4513. Here, the coloring layer 4301 is provided such that its end portion overlaps the light-blocking layer 4302, whereby light leakage can be reduced. For the light-blocking layer 4302, a material that blocks light from the light-emitting element 4513 can be used; for example, a black matrix can be formed using a metal material or a resin material containing pigment or dye.

In addition, if needed, a polarizing plate, a circularly polarizing plate (including an elliptically polarizing plate), or a retardation plate (a quarter-wave plate or a half-wave plate) may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on a surface to reduce the glare can be performed.

When the light-emitting element has a microcavity structure, light with high color purity can be extracted.

The first electrode layer (also referred to as a pixel electrode) and the second electrode layer (also referred to as a common electrode layer, a counter electrode layer, or the like) for applying voltage to the display element each have either a light-transmitting property or a light-reflecting property, which depends on the direction in which light is extracted, the position where the electrode layer is provided, and the pattern structure of the electrode layer.

The first electrode layer 4030 and the second electrode layer 4031 can each be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 can each also be formed using one or more kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

A conductive composition containing a conductive macromolecule (also referred to as conductive polymer) can be used for the first electrode layer 4030 and the second electrode layer 4031. As the conductive macromolecule, a so-called π-electron conjugated conductive macromolecule can be used. For example, polyaniline and a derivative thereof, polypyrrole and a derivative thereof, polythiophene and a derivative thereof, and a copolymer of two or more of aniline, pyrrole, and thiophene and a derivative thereof can be given.

Since the transistor is easily broken by static electricity or the like, a protective circuit for protecting the driver circuit is preferably provided. The protective circuit is preferably formed using a nonlinear element.

As illustrated in FIG. 11A, by employing the color filter method in which the light-emitting element 4513 that emits white light and the coloring layer are combined, the productivity of the display device of one embodiment of the present invention can be increased.

FIG. 11B is a cross-sectional view taken along a dotted line N1-N2 in FIG. 9B and the display device in FIG. 11B is different from the display device having the structure illustrated in FIG. 11A in that no color filter is included and the separate coloring method is employed. In the display device employing a separate coloring method, the emission color of the light-emitting element 4513 can be white, red, green, blue, cyan, magenta, yellow, or the like depending on the material for the light-emitting layer 4511.

When the separate coloring method is employed as illustrated in FIG. 11B, light with high color purity can be extracted. Note that when the display device employing the separate coloring method is provided with a color filter, light with higher color purity can be extracted.

Note that a color conversion method, a quantum dot method, or the like may be employed in the display device of one embodiment of the present invention.

This embodiment can be implemented in an appropriate combination with any of the structures described in the other embodiments and the like.

Embodiment 3

In this embodiment, examples of a transistor that can be used as the transistors described in the above embodiments will be described with reference to drawings.

The display device of one embodiment of the present invention can be fabricated using a transistor with any of various structures, such as a bottom-gate transistor or a top-gate transistor. Therefore, a material used for a semiconductor layer or the structure of a transistor can be easily changed in accordance with the existing production line.

Bottom-Gate Transistor

FIG. 12A1 is a cross-sectional view of a channel-protective transistor 810 that is a kind of bottom-gate transistor. In FIG. 12A1, the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 has a function of a gate electrode. The insulating layer 726 has a function of a gate insulating layer.

The transistor 810 includes an insulating layer 741 over a channel formation region in the semiconductor layer 742. The transistor 810 includes an electrode 744a and an electrode 744b, which are in contact with part of the semiconductor layer 742 and over the insulating layer 726. The electrode 744a has a function of one of a source electrode and a drain electrode. The electrode 744b has a function of the other of the source electrode and the drain electrode. Part of the electrode 744a and part of the electrode 744b are formed over the insulating layer 741.

The insulating layer 741 has a function of a channel protective layer. With the insulating layer 741 provided over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. According to one embodiment of the present invention, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used for regions of the electrodes 744a and 744b that are in contact with at least the semiconductor layer 742. The carrier concentration in the regions of the semiconductor layer 742 where oxygen vacancies are generated is increased, so that the regions become n-type regions (n$^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce the contact resistance between the semiconductor layer 742 and each of the electrodes 744a and 744b. Accordingly, the electrical characteristics of the transistor, such as the field-effect mobility and the threshold voltage, can be favorable.

In the case where a semiconductor such as silicon is used for the semiconductor layer 742, a layer that serves as an n-type semiconductor or a p-type semiconductor is preferably provided between the semiconductor layer 742 and each of the electrodes 744a and 744b. The layer that functions as an n-type semiconductor or a p-type semiconductor can function as the source region or the drain region of the transistor.

The insulating layer 729 is preferably formed using a material that has a function of preventing or reducing diffusion of impurities into the transistor from the outside. The insulating layer 729 can be omitted as necessary.

A transistor 811 illustrated in FIG. 12A2 is different from the transistor 810 in including an electrode 723 that has a function of a back gate electrode over the insulating layer 729. The electrode 723 can be formed using a material and a method similar to those of the electrode 746.

In general, a back gate electrode is formed using a conductive layer and positioned so that a channel formation region in a semiconductor layer is sandwiched between a gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The electrode 746 and the electrode 723 can each function as a gate electrode. Thus, the insulating layers 726, 741, 728, and 729 can each function as a gate insulating layer. The electrode 723 may be provided between the insulating layers 728 and 729.

In the case where one of the electrodes 746 and 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. Alternatively, one of the electrodes 746 and 723 may be referred to as a "first gate electrode", and the other may be referred to as a "second gate electrode".

When the electrodes 746 and 723 are provided with the semiconductor layer 742 therebetween and the electrodes 746 and 723 have the same potential, a region of the semiconductor layer 742 through which carriers flow is enlarged in the film thickness direction; thus, the number of transferred carriers is increased. As a result, the on-state current and field-effect mobility of the transistor 811 are increased.

Therefore, the on-state current of the transistor 811 is high relative to its area. That is, the area of the transistor 811 can be small relative to a required on-state current. According to one embodiment of the present invention, the area of a transistor can be reduced.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer to cover the semiconductor layer, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

According to one embodiment of the present invention, a highly reliable transistor can be provided. Furthermore, a highly reliable display device and the like can be provided.

FIG. 12B1 is a cross-sectional view of a channel-protective transistor 820 that is a bottom-gate transistor. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening formed by selectively removing part of the insulating layer 741 that overlaps the semiconductor layer 742. The semiconductor layer 742 is electrically connected to the electrode 744b through another opening formed by selectively removing part of the insulating layer 741 that overlaps the semiconductor layer 742. A region of the insulating layer 741 that overlaps the channel formation region has a function of a channel protective layer.

A transistor 821 illustrated in FIG. 12B2 is different from the transistor 820 in including the electrode 723 that has a function of a back gate electrode over the insulating layer 729.

With the insulating layer 729, the semiconductor layer 742 can be prevented from being exposed at the time of forming the electrodes 744a and 744b. Thus, the semiconductor layer 742 can be prevented from being reduced in thickness at the time of forming the electrodes 744a and 744b.

The distance between the electrode 746 and the electrode 744a and the distance between the electrode 746 and the electrode 744b in the transistors 820 and 821 are longer than those in the transistors 810 and 811. Thus, the parasitic capacitance generated between the electrode 744a and the electrode 746 can be reduced. The parasitic capacitance generated between the electrode 744b and the electrode 746 can also be reduced. According to one embodiment of the present invention, a transistor with favorable electrical characteristics can be provided.

A transistor 825 illustrated in FIG. 12C1 is a channel-etched transistor that is a bottom-gate transistor. In the transistor 825, the electrodes 744a and 744b are formed without providing the insulating layer 741. Thus, part of the semiconductor layer 742 that is exposed at the time of forming the electrodes 744a and 744b is etched in some cases. However, since the insulating layer 741 is not provided, the productivity of the transistor can be increased.

A transistor 826 illustrated in FIG. 12C2 is different from the transistor 825 in including the electrode 723 that has a function of a back gate electrode over the insulating layer 729.

Top-Gate Transistor

A transistor 842 illustrated in FIG. 13A1 is a top-gate transistor. In the transistor 842, the electrodes 744a and 744b are formed after the formation of the insulating layer 729. The electrodes 744a and 744b are electrically connected to the semiconductor layer 742 through openings formed in the insulating layers 728 and 729.

Part of the insulating layer 726 that does not overlap the electrode 746 is removed, and as illustrated in FIG. 13A3, an impurity 755 is introduced into the semiconductor layer 742 using the electrode 746 and the remaining part of the insulating layer 726 as a mask, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced without through the insulating layer 726. A lightly doped drain (LDD) region is formed in a region of the semiconductor layer 742 that does not overlap the electrode 746.

A transistor 843 illustrated in FIG. 13A2 is different from the transistor 842 in including the electrode 723 formed over the substrate 771. The electrode 723 includes a region overlapping the semiconductor layer 742 with the insulating layer 772 therebetween. The electrode 723 can function as a back gate electrode.

As in a transistor 844 illustrated in FIG. 13B1 and a transistor 845 illustrated in FIG. 13B2, the insulating layer 726 in a region that does not overlap the electrode 746 may be completely removed. Alternatively, as in a transistor 846 illustrated in FIG. 13C1 and a transistor 847 illustrated in FIG. 13C2, the insulating layer 726 may be left.

In the transistors 843 to 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided.

This embodiment can be implemented in an appropriate combination with any of the structures described in the other embodiments and the like.

Embodiment 4

Examples of electronic devices that can use the display device of one embodiment of the present invention include displays, personal computers, image storage devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 14A to 14F illustrate specific examples of these electronic devices.

Figure 14A:
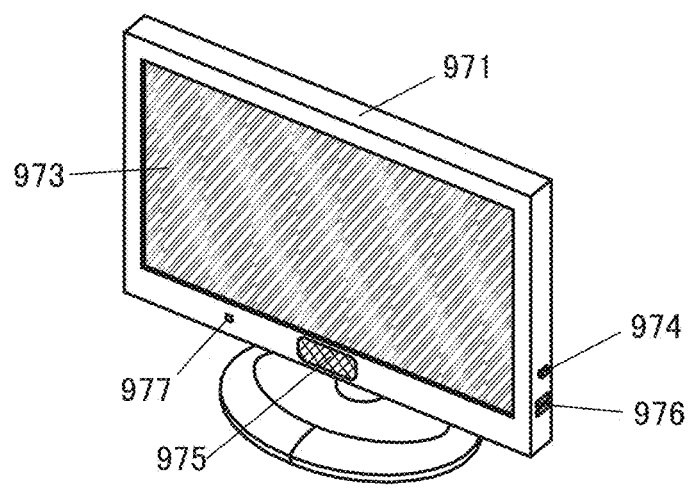
FIGS. 14A to 14F each illustrate an example of an electronic device.

FIG. 14A illustrates a television, which includes a housing 971, a display portion 973, an operation key 974, a speaker 975, a communication connection terminal 976, an optical sensor 977, and the like. The display portion 973 may include a touch sensor that enables input operation. When the display device of one embodiment of the present invention is used for the display portion 973, a high-luminance image can be displayed on the display portion 973 and the dynamic range can be increased.

Figure 14B:
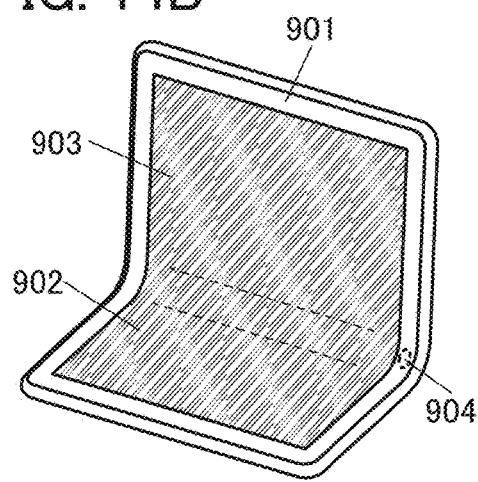

FIG. 14B illustrates an information processing terminal which includes a housing 901, a display portion 902, a display portion 903, a sensor 904, and the like. The display portions 902 and 903 are formed using one display panel and are flexible. The housing 901 is also flexible; thus, the information processing terminal can be used in a bent state as illustrated in FIG. 14B and can also be used in a flat plate-like shape like a tablet terminal. The sensor 904 can sense the shape of the housing 901, and for example, it is possible to switch display on the display portions 902 and 903 when the housing 901 is bent. When the display device of one embodiment of the present invention is used for the display portions 902 and 903, a high-luminance image can be displayed on the display portions 902 and 903, and the dynamic range can be increased.

Figure 14C:
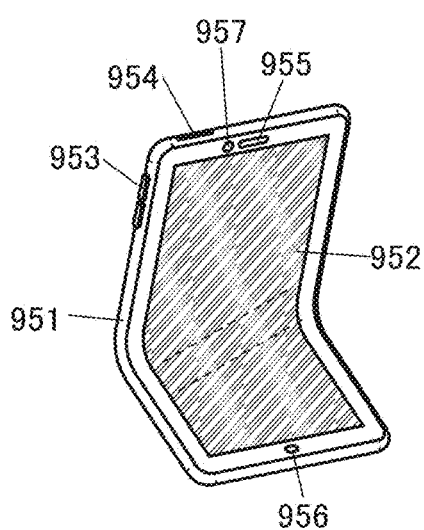

FIG. 14C illustrates an example of a mobile phone which includes a housing 951, a display portion 952, an operation button 953, an external connection port 954, a speaker 955, a microphone 956, a camera 957, and the like. The display portion 952 of the mobile phone includes a touch sensor. Operations such as making a call and inputting text can be performed by touch on the display portion 952 with a finger, a stylus, or the like. The housing 951 and the display portion 952 have flexibility and thus the mobile phone can be used in a bent state as illustrated in FIG. 14C. When the display device of one embodiment of the present invention is used for the display portion 952, a high-luminance image can be displayed on the display portion 952 and the dynamic range can be increased.

Figure 14D:
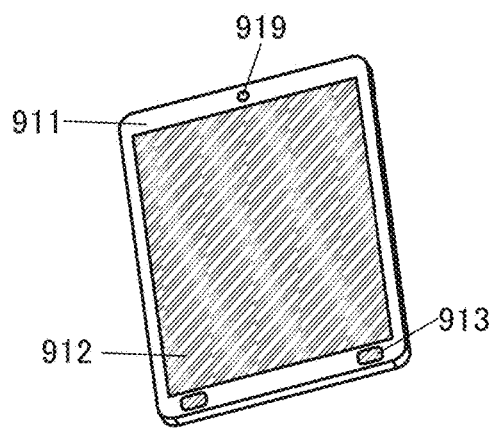

FIG. 14D illustrates a portable information terminal, which includes a housing 911, a display portion 912, speakers 913, a camera 919, and the like. A touch panel function of the display portion 912 enables input and output of information. When the display device of one embodiment of the present invention is used for the display portion 912, a high-luminance image can be displayed on the display portion 912 and the dynamic range can be increased.

Figure 14E:
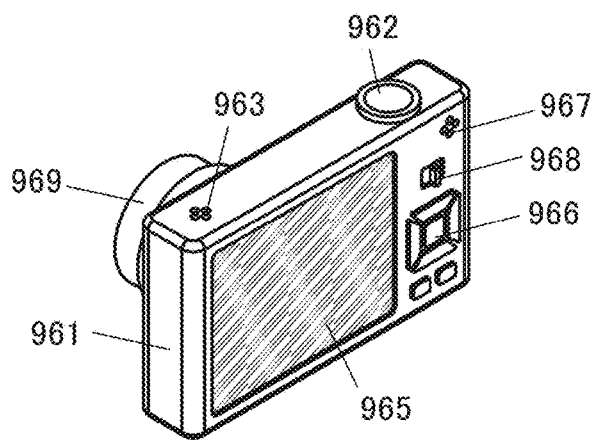

FIG. 14E illustrates a digital camera, which includes a housing 961, a shutter button 962, a microphone 963, a display portion 965, operation keys 966, a speaker 967, a zoom lever 968, a lens 969, and the like. When the display device of one embodiment of the present invention is used for the display portion 965, a high-luminance image can be displayed on the display portion 965 and the dynamic range can be increased.

Figure 14F:
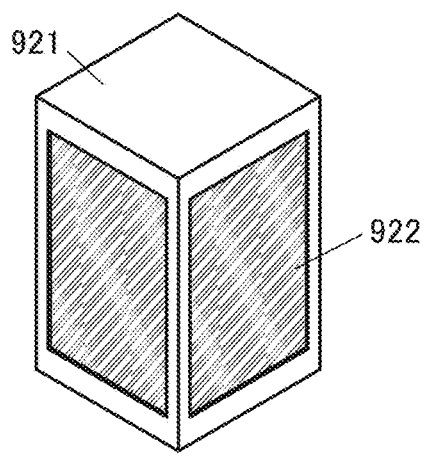

FIG. 14F illustrates a digital signage in which large display portions 922 are installed on the side surfaces of a pillar 921. When the display device of one embodiment of the present invention is used for the display portions 922, a high-luminance image can be displayed on the display portions 922 and the dynamic range can be increased.

This embodiment can be implemented in an appropriate combination with any of the structures described in the other embodiments and the like.

Embodiment 5

This embodiment will describe a semiconductor device that can be used in a memory device such as an image storage device, which is given as an example in the above embodiment.

In this embodiment, a DOSRAM (registered trademark) is described as an example of a memory device using an oxide semiconductor. Note that DOSRAM stands for dynamic oxide semiconductor random access memory. A DOSRAM is a memory device composed of one—transistor one-capacitor (1T1C) memory cells in which an oxide semiconductor is used for write transistors.

An example of a stacked-layer structure of a DOSRAM 1000 is described with reference to FIG. 15. In the DOSRAM 1000, a sense amplifier unit 1002 for reading data and a cell array unit 1003 for storing data are stacked.

Figure 15:
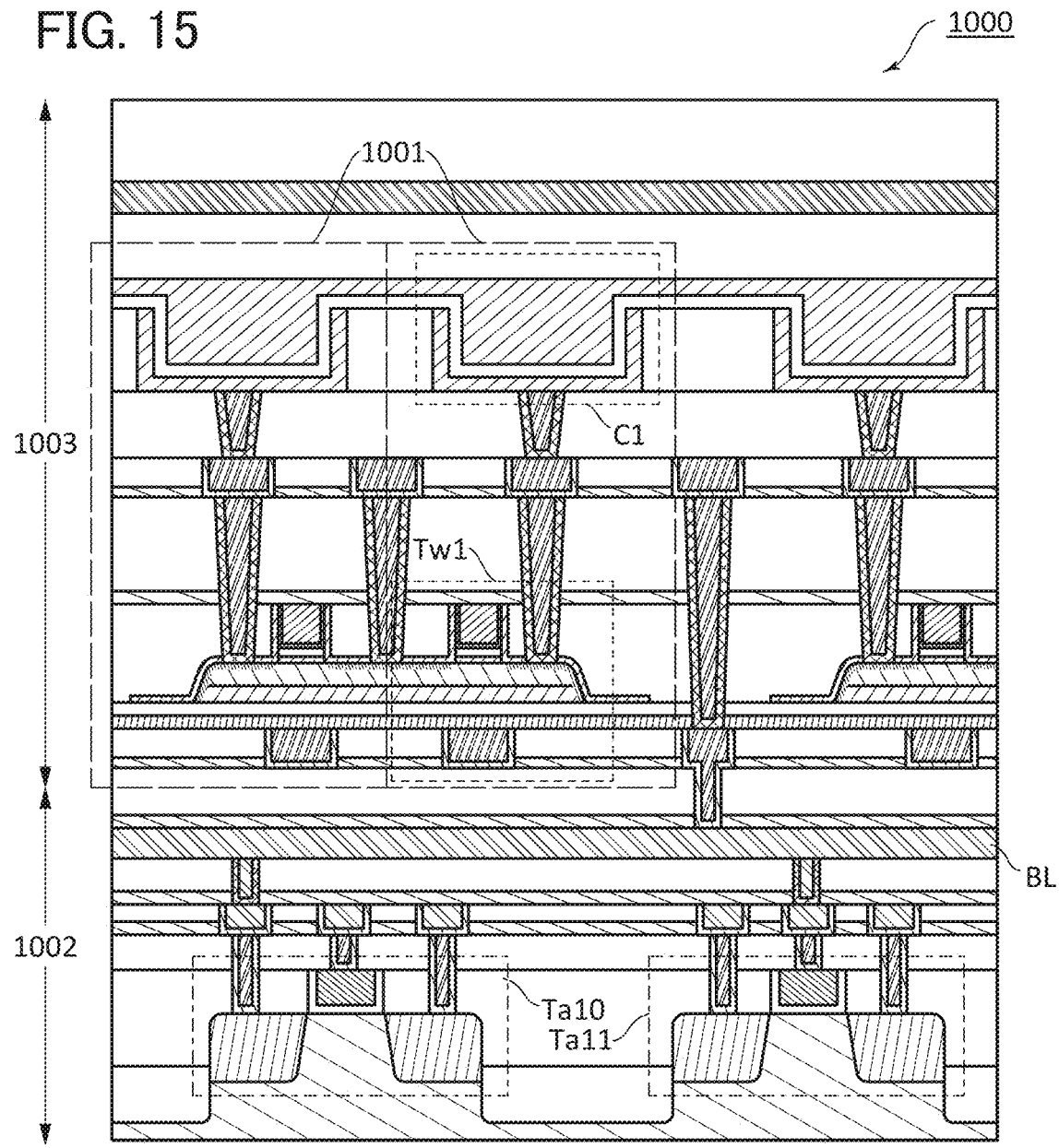
FIG. 15 is a cross-sectional view illustrating a structure example of a DOSRAM.

As illustrated in FIG. 15, a bit line BL and Si transistors Ta10 and Ta11 are provided in the sense amplifier unit 1002. The Si transistors Ta10 and Ta11 each have a semiconductor layer in a single crystal silicon wafer. The Si transistors Ta10 and Ta11 are included in a sense amplifier and are electrically connected to the bit line BL.

The cell array unit 1003 includes a plurality of memory cells 1001. The memory cell 1001 includes a transistor Tw1 and a capacitor C1. In the cell array unit 1003, two transistors Tw1 share a semiconductor layer. The semiconductor layer is electrically connected to the bit line BL through a conductor that is not illustrated in FIG. 15.

The stacked-layer structure illustrated in FIG. 15 can be applied to a variety of semiconductor devices formed by stacking a plurality of circuits each including a transistor group.

Metal oxides, insulators, conductors, and the like in FIG. 15 may each have a single-layer structure or a stacked-layer structure. They can be formed by any of a variety of deposition methods such as a sputtering method, a molecular beam epitaxy (MBE) method, a pulsed laser ablation (PLA) method, a chemical vapor deposition (CVD) method, and an atomic layer deposition (ALD) method. Examples of a CVD method include a plasma CVD method, a thermal CVD method, and a metal organic CVD method.

Here, the semiconductor layer of the transistor Tw1 is formed using a metal oxide (oxide semiconductor). In the example illustrated here, the semiconductor layer is formed using three metal oxide layers. The semiconductor layer is preferably formed using a metal oxide containing In, Ga, and Zn.

Note that when an element that forms an oxygen vacancy or an element that can be bonded to an oxygen vacancy is added to a metal oxide, the carrier density of the metal oxide is increased and the resistance thereof is reduced in some cases. For example, when a semiconductor layer containing a metal oxide is selectively reduced in resistance, a source region and a drain region can be provided in the semiconductor layer.

Typical examples of an element that can reduce the resistance of a metal oxide are boron and phosphorus. Moreover, hydrogen, carbon, nitrogen, fluorine, sulfur, chlorine, titanium, a rare gas, or the like may be used. Typical examples of a rare gas include helium, neon, argon, krypton, and xenon. The concentration of such an element can be measured by secondary ion mass spectrometry (SIMS) or the like.

The use of boron or phosphorus is particularly preferable because the apparatus used in a manufacturing line for amorphous silicon or low-temperature polysilicon can be used. Since the existing equipment can be used, capital investment can be reduced in that case.

A transistor including a semiconductor layer having a selectively reduced resistance can be formed using a dummy gate, for example. Specifically, the dummy gate is provided over the semiconductor layer, and an element that can reduce the resistance of the semiconductor layer is added to the semiconductor layer using the dummy gate as a mask. Thus, the element is added to a region of the semiconductor layer that does not overlap the dummy gate, whereby a low-resistance region is formed. For the addition of the element, an ion implantation method by which an ionized source gas is subjected to mass separation and then added, an ion doping method by which an ionized source gas is added without mass separation, a plasma immersion ion implantation method, or the like can be used.

Examples of conductive materials used for the conductors include a semiconductor typified by polycrystalline silicon doped with an impurity element such as phosphorus; silicide such as nickel silicide; a metal such as molybdenum, titanium, tantalum, tungsten, aluminum, copper, chromium, neodymium, and scandium; and a metal nitride containing any of the above metals as its component (tantalum nitride, titanium nitride, molybdenum nitride, and tungsten nitride). It is also possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Examples of insulating materials used for the insulators include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Note that in this specification and the like, an oxynitride refers to a compound in which oxygen content is higher than nitrogen content, and a nitride oxide refers to a compound in which nitrogen content is higher than oxygen content.

This embodiment can be implemented in an appropriate combination with any of the structures described in the other embodiments and the like.

Example 1

In this example, measurement results of the emission luminance of an EL element included in a display device of one embodiment of the present invention and measurement results of the relationship between γ and grayscale will be described.

In this example, the emission luminance of the EL element 104 in the display device that includes the pixel 10d having the configuration shown in FIG. 8 was measured. Specifically, the emission luminance of the EL element 104 when the pixel 10d was supplied with only the image signal S1 (condition 1) and the emission luminance of the EL element 104 when the pixel 10d was supplied with the image signals S1 and S2 (condition 2) were measured. Here, the ratio of the capacitance value $C_1$ of the capacitor 113 to the capacitance value $C_2$ of the capacitor 103 ($C_1/C_2$) was 4/1, the potential $V_{ol}$ was 0 V, the potential of the wiring 130 was 0 V, the potential of the power supply line 128 was 12 V, and the potential of the common wiring 129 was −2 V. Under the condition 1, the potential $V_{S1}$ of the image signal S1 was 5 V, and under the condition 2, the potential $V_{S1}$ of the image signal S1 and the potential $V_{S2}$ of the image signal S2 were each 5 V.

Table 1 shows the values of the potential $V_{NM}$ of the node NM under the conditions 1 and 2 calculated using Formula 1 shown in Embodiment 1. The measurement results of the emission luminance of the EL element 104 under the conditions 1 and 2 are also shown.

TABLE 1

|  | condition 1 | condition 2 |
|---|---|---|
| potential $V_{NM}$ | 5 V | 9 V |
| luminance | 612 cd/m² | 1329 cd/m² |

As shown in Table 1, it was confirmed that the emission luminance of the EL element 104 was high when the pixel 10d was supplied with the image signals S1 and S2 as compared with the case where the pixel 10d was supplied with only the image signal S1.

In addition, the relationship between γ and grayscale in the display device that includes the pixel 10d having the configuration shown in FIG. 8 was measured. Specifically, the relationship between γ and grayscale when the pixel 10*d* was supplied with only the image signal S1 (condition 3) and the relationship between γ and grayscale when the pixel 10*d* was supplied with the image signals S1 and S2 (condition 4) were measured. Here, as in the conditions 1 and 2 described above, the ratio $C_1/C_2$ was 4/1, the potential $V_{ol}$ was 0 V, the potential of the wiring 130 was 0 V, the potential of the power supply line 128 was 12 V, and the potential of the common wiring 129 was −2 V. The potential $V_{S1}$ was equal to the potential $V_{S2}$; when the grayscale was 0, the potentials $V_{S1}$ and $V_{S2}$ were 1 V, and when the grayscale was 255, the potentials $V_{S1}$ and $V_{S2}$ were 5 V.

Figure 16:
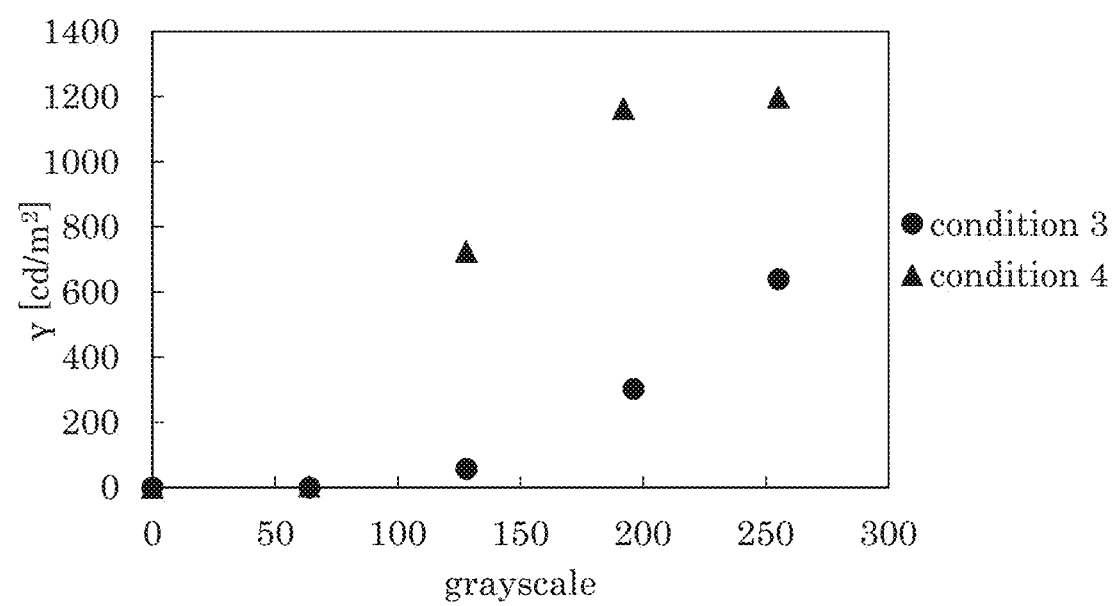
FIG. 16 is a graph showing a relationship between γ and gray scale.

FIG. 16 shows the measurement results of the relationship between γ and grayscale under the conditions 3 and 4. As shown in FIG. 16, at each scale where the measurement was performed, it was confirmed that γ was higher when the pixel 10*d* was supplied with the image signals S1 and S2 (condition 4) than that in the case where the pixel 10*d* was supplied with only the image signal S1 (condition 3).

Example 2

In this example, display results in the case where an image is displayed using the display device of one embodiment of the present invention will be described.

In this example, an image was displayed using the display device that includes the pixel 10*d* having the configuration shown in FIG. 8. Specifically, the image P1 corresponding to the image signal S1, the image P2 corresponding to the image signal S2, and an image obtained by superimposing the images P1 and P2 on each other were displayed. Note that the ratio of the capacitance value $C_1$ of the capacitor 113 to the capacitance value $C_2$ of the capacitor 103 ($C_1/C_2$) was 4/1, the potential $V_{ol}$ was 0 V, the potential of the wiring 130 was 0 V, the potential of the power supply line 128 was 10 V, and the potential of the common wiring 129 was −2 V.

Figure 17:
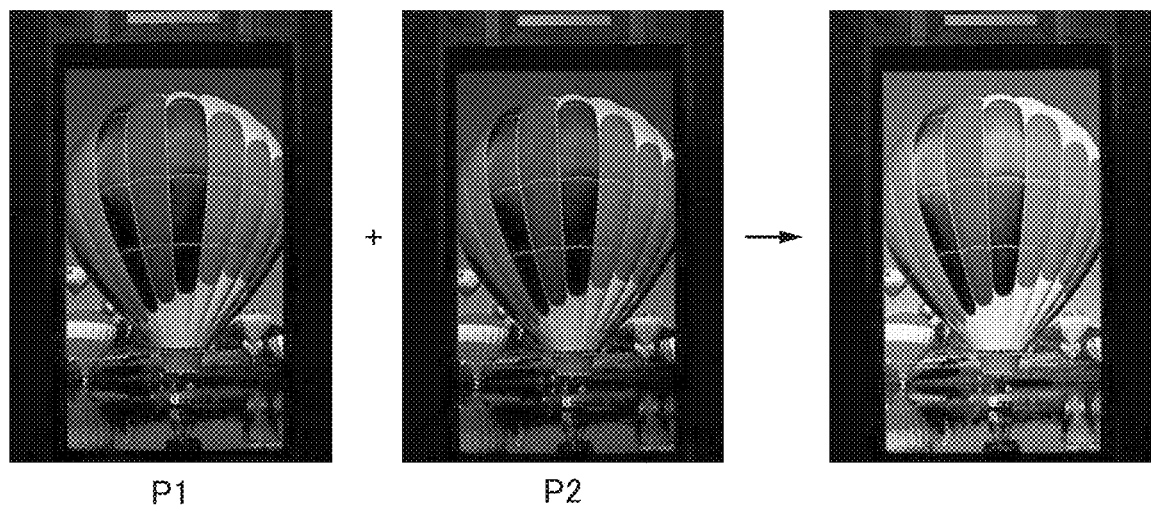
FIG. 17 shows display results.

As shown in FIG. 17, it was confirmed that a high-luminance image was displayed when the images P1 and P2 were superimposed on each other as compared with the case where only the image P1 or the image P2 was displayed.

REFERENCE NUMERALS

10: pixel, 10*a*: pixel, 10*b*: pixel, 10*c*: pixel, 10*d*: pixel, 12: gate driver, 13: source driver, 14: illuminance sensor, 15: demultiplexer, 102: transistor, 103: capacitor, 104: EL element, 105: transistor, 111: transistor, 112: transistor, 113: capacitor, 114: transistor, 121: wiring, 122: wiring, 124: wiring, 125: wiring, 126: wiring, 128: power source line, 129: common wiring, 130: wiring, 200: display device, 215: display portion, 221: scan line driver circuit, 231: signal line driver circuit, 232: signal line driver circuit, 241: common line driver circuit, 723: electrode, 726: insulating layer, 728: insulating layer, 729: insulating layer, 741: insulating layer, 742: semiconductor layer, 744*a*: electrode, 744*b*: electrode, 746: electrode, 755: impurity, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 901: housing, 902: display portion, 903: display portion, 904: sensor, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 1000: DOSRAM, 1001: memory cell, 1002: sense amplifier unit, 1003: cell array unit, 4001: substrate, 4005: sealant, 4006: substrate, 4010: transistor, 4011: transistor, 4014: wiring, 4015: electrode, 4017: electrode, 4018: FPC, 4019: anisotropic conductive layer, 4020: capacitor, 4021: electrode, 4030: electrode layer, 4031: electrode layer, 4041: printed circuit board, 4042: integrated circuit, 4102: insulating layer, 4103: insulating layer, 4110: insulating layer, 4111: insulating layer, 4112: insulating layer, 4200: input device, 4210: touch panel, 4227: electrode, 4228: electrode, 4237: wiring, 4238: wiring, 4239: wiring, 4263: substrate, 4272: FPC, 4273: IC, 4301: coloring layer, 4302: light-blocking layer, 4510: partition wall, 4511: light-emitting layer, 4513: light-emitting element, and 4514: filler.

This application is based on Japanese Patent Application Serial No. 2017-216389 filed with Japan Patent Office on Nov. 9, 2017 and Japanese Patent Application Serial No. 2018-028368 filed with Japan Patent Office on Feb. 21, 2018, the entire contents of which are hereby incorporated by reference.

The invention claimed is:

1. A display device comprising:
   a pixel; and
   a circuit,
   wherein the pixel comprises a first transistor, a second transistor, a third transistor, a fourth transistor, a first capacitor, a second capacitor, and a display element,
   wherein one of a source and a drain of the first transistor is electrically connected to one electrode of the first capacitor,
   wherein the other of the source and the drain of the first transistor is electrically connected to a first wiring,
   wherein one of a source and a drain of the second transistor is electrically connected to the other electrode of the first capacitor,
   wherein the other of the source and the drain of the second transistor is electrically connected to a second wiring,
   wherein the one electrode of the first capacitor is electrically connected to a gate of the third transistor,
   wherein the gate of the third transistor is electrically connected to one electrode of the second capacitor,
   wherein one of a source and a drain of the third transistor is electrically connected to the other electrode of the second capacitor,
   wherein the other electrode of the second capacitor is electrically connected to one of a source and a drain of the fourth transistor,
   wherein the other of the source and the drain of the fourth transistor is electrically connected to one electrode of the display element,
   wherein the circuit is electrically connected to the first wiring and the second wiring,
   wherein the circuit is configured to supply a first image signal to the first wiring,
   wherein the circuit is configured to supply a reference potential to the second wiring, and
   wherein the circuit is configured to supply a second image signal to the second wiring.

2. The display device according to claim 1, wherein the reference potential is a potential having a value corresponding to an illuminance of external light.

3. The display device according to claim 2, wherein the reference potential is lower as the illuminance of the external light is higher.

4. The display device according to claim 2, wherein the reference potential is a negative potential.

5. The display device according to claim 1, wherein a capacitance value of the first capacitor is higher than a capacitance value of the second capacitor.

6. The display device according to claim 1, wherein the display element is an organic EL element.

7. The display device according to claim 1,
wherein the first transistor comprises a metal oxide in a channel formation region of the first transistor,
wherein the metal oxide comprises In, Zn, and M, and
wherein M is Al, Ti, Ga, Sn, Y, Zr, La, Ce, Nd, or Hf.

8. An electronic device comprising:
the display device according to claim 1; and
a camera.

9. An operation method of a display device comprising a pixel that comprises a display element and a memory circuit which is electrically connected to a first wiring and a second wiring, comprising the steps of:
supplying a reference potential to the first wiring;
supplying a first image signal to the memory circuit through the second wiring so that a first potential is written to a node of the memory circuit, wherein the node is electrically connected to the second wiring through a first transistor;
supplying a second image signal to the memory circuit through the first wiring so that a second potential is written to the node of the memory circuit, wherein the node is electrically connected to the first wiring through a capacitor and a second transistor; and
displaying an image obtained by superimposing an image corresponding to the first image signal and an image corresponding to the second image signal on each other with the display element.

10. The operation method of the display device according to claim 9, wherein the reference potential is a potential having a value corresponding to an illuminance of external light.

11. The operation method of the display device according to claim 10, wherein the reference potential is lower as the illuminance of the external light is higher.

12. The operation method of the display device according to claim 10, wherein the reference potential is a negative potential.

* * * * *